US008669040B2

(12) United States Patent
Tashiro et al.

(10) Patent No.: US 8,669,040 B2
(45) Date of Patent: Mar. 11, 2014

(54) METHOD OF MANUFACTURING RELIEF PRINTING PLATE AND PRINTING PLATE PRECURSOR FOR LASER ENGRAVING

(75) Inventors: Hiroshi Tashiro, Shizuoka-ken (JP); Atsushi Sugasaki, Shizuoka-ken (JP); Hisao Yamamoto, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 718 days.

(21) Appl. No.: 12/320,226

(22) Filed: Jan. 22, 2009

(65) Prior Publication Data

US 2009/0191481 A1 Jul. 30, 2009

(30) Foreign Application Priority Data

Jan. 25, 2008 (JP) ................................ 2008-015457
Aug. 20, 2008 (JP) ................................ 2008-211830

(51) Int. Cl.

*B41N 1/00* (2006.01)
*B41F 33/00* (2006.01)
*G03F 7/00* (2006.01)
*G03F 7/26* (2006.01)

(52) U.S. Cl.

USPC ..................... 430/306; 430/270.1; 430/281.1; 430/296; 430/309; 101/395; 101/483

(58) Field of Classification Search

USPC .......................................................... 430/306
See application file for complete search history.

(56) References Cited

U.S. PATENT DOCUMENTS 7,342,685 B2 * 3/2008 Minnebo et al. ............... 358/1.9
2004/0028875 A1 * 2/2004 Van Rijn et al. ................ 428/98
2005/0032000 A1 * 2/2005 Goodin ......................... 430/320
2006/0078826 A1 * 4/2006 Sonokawa .................... 430/302
2007/0231737 A1 * 10/2007 Sugasaki .................... 430/270.1
2008/0018943 A1 * 1/2008 Eyal et al. .................... 358/3.29
2009/0123712 A1 * 5/2009 Sugasaki .................... 428/195.1
2010/0143840 A1 * 6/2010 Veres et al. ................ 430/270.1

FOREIGN PATENT DOCUMENTS

EP 1710094 A 10/2006
EP 1710094 A1 * 10/2006
EP 1731325 12/2006
EP 1731325 A1 * 12/2006
EP 1840139 A 10/2007
JP 11-58665 6/1989

(Continued)

OTHER PUBLICATIONS

Extended European Search Report dated Apr. 20, 2009.

(Continued)

*Primary Examiner* — Chanceity Robinson

(74) *Attorney, Agent, or Firm* — SOLARIS Intellectual Property Group, PLLC

(57) ABSTRACT

The invention provides a method of manufacturing a relief printing plate having at least engraving an area which is in a relief forming layer of a relief printing plate precursor for laser engraving and is to be exposed by scanning exposure using a fiber-coupled semiconductor laser which emits laser beam with a wavelength of 700 nm to 1,300 nm. The relief printing plate precursor has at least a relief forming layer provided over a support, and the relief forming layer contains at least a binder polymer and a photo-thermal conversion agent. The invention further provides a relief printing plate precursor for laser engraving which can be used in the method of manufacturing a relief printing plate.

9 Claims, 1 Drawing Sheet

(56) References Cited

FOREIGN PATENT DOCUMENTS

| | | | |
|---|---|---|---|
| JP | 11-84149 | | 7/1989 |
| JP | 2773847 | | 2/1994 |
| JP | A 9-171247 | | 6/1997 |
| JP | A 2000-168253 | | 6/2000 |
| JP | A 2000-318330 | | 11/2000 |
| JP | 2007090541 A | * | 4/2007 |
| JP | A 2007-90541 | | 4/2007 |
| JP | 2007-320306 | | 12/2007 |

OTHER PUBLICATIONS

Japanese Office Action dated Sep. 25, 2012, issued in the corresponding to Japanese Patent Application.

Corresponding the Japanese Patent Office Action issued on Mar. 5, 2013 with the Partial English Translation.

* cited by examiner

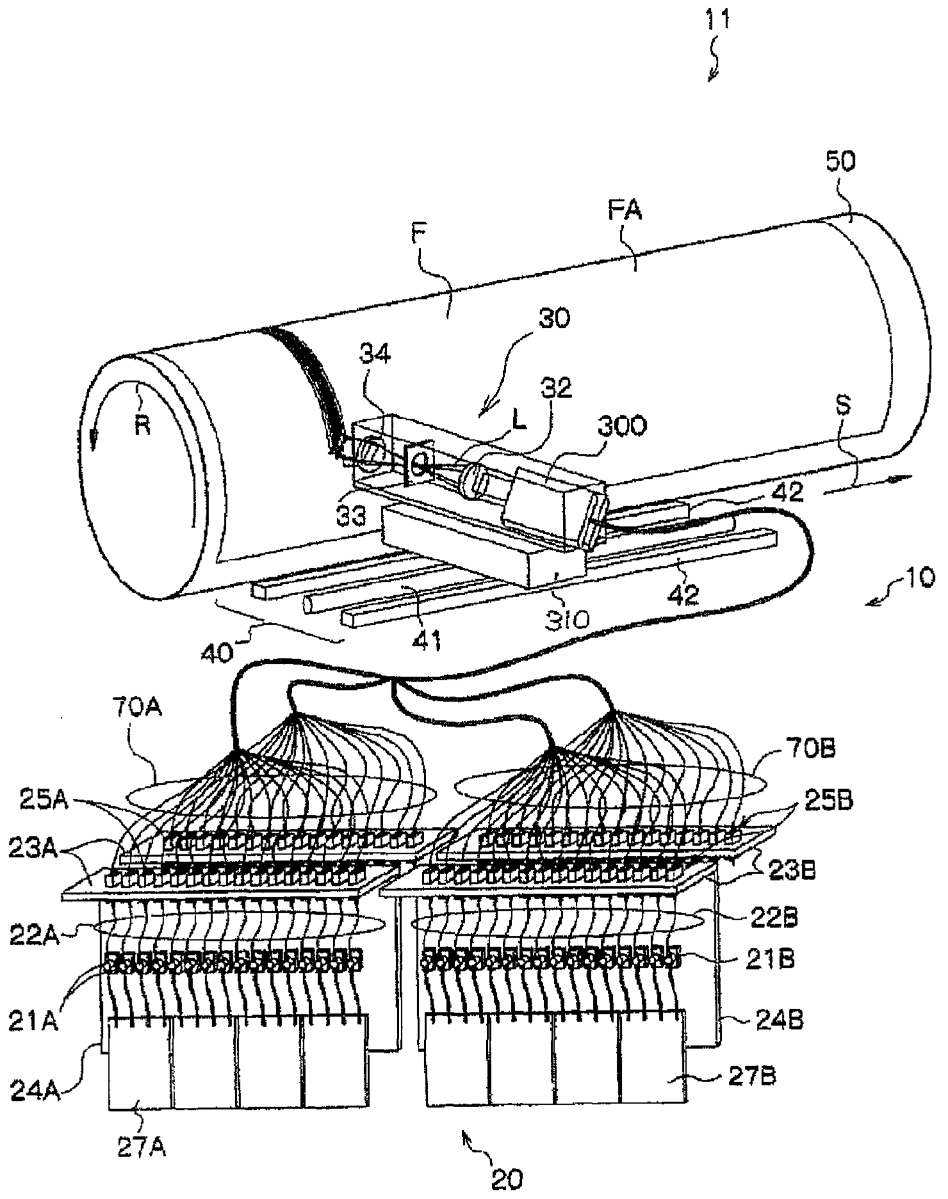
11
50
FA
F
30
34
32
L
300
S
R
33
42
42
10
310
41
40
70A
70B
25A
25B
23A
23B
22A
22B
21B
21A
24B
27B
24A
27A
20

METHOD OF MANUFACTURING RELIEF PRINTING PLATE AND PRINTING PLATE PRECURSOR FOR LASER ENGRAVING

CROSS-REFERENCE TO RELATED APPLICATION

This application claims priority under 35 USC 119 from Japanese Patent Application Nos. 2008-15457 filed on Jan. 25, 2008 and 2008-211830 filed on Aug. 20, 2008 the disclosures of which are incorporated by reference herein.

BACKGROUND OF THE INVENTION

1. Technical field

The present invention relates to a method of manufacturing a relief printing plate and a printing plate precursor for laser engraving, which is used for the manufacturing method.

2. Description of the Related Art

As a method for forming a printing plate by forming a concave-convex structure on a photosensitive resin layer laminated on the surface of a support, a method of exposing a relief forming layer which has been formed using a photosensitive composition, to ultraviolet radiation through an original image film so as to selectively cure image areas, and removing uncured parts by means of a developer solution, that is, so-called "analogue plate making", is well known.

A relief printing plate is a letterpress printing plate having a relief layer with a concave-convex structure, and such a relief layer having a concave-convex structure may be obtained by patterning a relief forming layer formed from a photosensitive composition containing, as a main component, for example, an elastomeric polymer such as synthetic rubber, a resin such as a thermoplastic resin, or a mixture of a resin and a plasticizer, to thus form a concave-convex structure. Among such relief printing plates, a printing plate having a flexible relief layer is often referred to as a flexo plate.

In the case of producing a relief printing plate by analogue plate making, since an original image film using a silver salt material is needed in general, the plate making process requires time and costs for the production of original image films. Furthermore, since chemical treatments are required in the development of original image films, and also treatments of development waste water are necessary, investigations on simpler methods of plate making, for example, methods which do not use original image films or methods which do not necessitate development treatments, are being undertaken.

SUMMARY

In recent years, a method of making a plate having a relief forming layer by means of scanning exposure, without requiring an original image film, is being investigated.

As a technique which does not require an original image film, there has been proposed a relief printing plate precursor in which a laser-sensitive type mask layer element capable of forming an image mask is provided on a relief forming layer (see, for example, Japanese Patent No. 2773847 and Japanese Patent Application Laid-Open (JP-A) No. 9-171247). The method of making such a plate precursor is referred to as a "mask CTP method", because an image mask having the same function as the original image film is formed from the mask layer element by means of laser irradiation that is based on image data. This method does not require an original image film, but the subsequent plate making treatment involves a process of exposing the plate precursor to ultraviolet radiation through an image mask, and then removing uncured parts by development, and from the viewpoint of requiring a development treatment, the method has a room for further improvement.

As a method of plate making which does not require a development process, a so-called "direct engraving CTP method", in which plate making is carried out by directly engraving a relief forming layer using laser, has been proposed a number of times. The direct engraving CTP method is literally a method of forming a concave-convex structure which will serve as relief, by engraving the structure with laser. This method is advantageous in that the relief shape can be freely controlled, unlike the relief formation processes using original image films. For this reason, in the case of forming images like cutout characters, it is possible to engrave the image regions deeper than other regions, or for microdot images, to carry out shouldered engraving in consideration of resistance to the printing pressure, or the like.

However, in this method, since high energy is required to form a relief having a concave-convex structure which can withstand the printing pressure, on a relief forming layer having a predetermined thickness, and the speed of laser engraving is slow, the method has a problem of low productivity as compared to the methods in which image formation involves the use of a mask. For this reason, it has been attempted to enhance the sensitivity of a relief printing plate precursor. For example, a flexographic printing plate precursor for laser engraving which includes an elastomer foam has been proposed (see JP-A No. 2002-357907). In this technology, an attempt is made to improve the engraving sensitivity by using a low density foamed material in a relief forming layer. However, due to being a foamed material having low density, there is a concern to the obtained printing plate with respect to lack of strength or the like, which might cause seriously impaired print durability.

A resin letterpress printing plate for laser engraving which contains a polymeric filler having a ceiling temperature of less than 600 K has been also proposed (see JP-A No. 2000-168253). In this technology, an attempt is made to improve the engraving sensitivity by adding a polymeric filler having a low depolymerization temperature. However, when such a polymeric filler is used, surface irregularities are generated on the surface of the printing plate precursor, and seriously affect the printing quality.

A material for laser engraving for a relief forming layer, containing a compound having an acid-decomposing functional group on the side chain and an acid generating agent, has been proposed (refer to JP-A No. 2007-90451). However, the thermal stability of the material is insufficient.

As will be understood from the above, when measures such as reducing the density of a relief forming layer or employing materials having low thermal resistance or high thermal response are taken in order to improve the sensitivity to laser of a relief forming layer, there is cause for concern that the storage stability or the physical properties of the resulting relief layer may be impaired.

The most widely-used laser for drawing an image by means of engraving is a $CO_2$ laser, with which high output can be achieved. In recent years, the use of fiber laser has been studied as well. However, although $CO_2$ laser enables high output, it can be difficult to conduct high-speed drawing of an image while also maintaining high output, as a result of which, improvements in productivity have not been achieved yet. A combined approach whereby fiber laser and $CO_2$ laser are used in combination in in order to achieve high-speed drawing of an image has been also investigated. However, the combined approach requires more complex operation and higher costs for the laser, which negates any advantages gained thereby when evaluated in terms of the overall improvement in productivity.

The present invention has been achieved by taking the above circumstances into consideration. The present invention provides a method of manufacturing a relief printing plate for laser engraving having high engraving sensitivity to laser, requiring lower cost and having excellent productivity. The present invention further provides a relief printing plate precursor having high engraving sensitivity that is suitable for the manufacturing method.

As a result of intensive research, the present inventors have found that the above issues can be addressed by subjecting a relief printing plate precursor, which is equipped with a relief forming layer containing a specific photo-thermal conversion agent, to a scanning exposure light using a semiconductor laser having fiber, whereupon the invention has been achieved.

Namely, a first aspect of the invention provides a method of manufacturing a relief printing plate, the method comprising engraving an area which is within a relief forming layer of a relief printing plate precursor for laser engraving and which is to be exposed to scanning exposure using a fiber-coupled semiconductor laser that emits a laser beam with a wavelength in a range of 700 nm to 1300 nm, the relief printing plate precursor comprising a relief forming layer provided over a support, and the relief forming layer comprising a binder polymer and a photo-thermal conversion agent.

The invention further provides, as a second aspect, a relief printing plate precursor for laser engraving which can be used in the method of manufacturing the relief printing plate.

The method of manufacturing a relief printing plate according to the invention can be advantageously employed even when the relief forming layer is formed of a hard resin, a soft resin or an elastomer. The use of a soft relief forming layer may enable to advantageously apply the method of manufacturing a relief printing plate according to the invention even to the manufacture of the so-called flexographic plate.

While a method of manufacturing an anastatic plate (a relief printing plate) is described hereinafter as a representative example, the applications of the method for the manufacture of a relief printing plate according to the invention is not limited thereto. The method for the manufacture of a relief printing plate according to the invention can be also utilized for the preparation of other material forms having unevenness or openings on a surface thereof, in addition to the preparation of various printing plates such as an intaglio printing plate or a mimeograph printing plate.

BRIEF DESCRIPTION OF THE DRAWING

FIG. 1 is a schematic diagram (perspective view) of a plate-making device having a laser recording device of one embodiment of one aspect of the invention.

DETAILED DESCRIPTION

The method for the manufacture of a relief printing plate according to the invention is a method of manufacturing a relief printing plate, the method includes at least engraving an area which is within a relief forming layer of a relief printing plate precursor for laser engraving and which is to be exposed to scanning exposure using a fiber-coupled semiconductor laser that emits a laser beam with a wavelength in a range of 700 nm to 1300 nm, the relief printing plate precursor has at least a relief forming layer provided over (on or above) a support, and the relief forming layer contains at least a binder polymer and a photo-thermal conversion agent.

Relief Printing Plate Precursor for Laser Engraving

The relief printing plate precursor for laser engraving which can be used for the method of manufacturing according to the invention has, on a support, a relief forming layer which can be engraved by laser. The relief forming layer is exposed to laser to form unevenness on the surface, whereby a relief layer is prepared. The relief layer is typically used as an anastatic plate (a relief printing plate) to perform printing by applying a printing ink on a convex portion(s) thereof Hereinafter, a layer which is an image forming layer having a flat surface to be subjected to laser engraving and contains a binder polymer is called a "relief forming layer", and a layer which is prepared by subjecting the relief forming layer to laser engraving and has unevenness on the surface formed by the laser engraving is called a "relief layer". When the relief layer contains a polymerizable compound in its formulation, the relief layer may be optionally subjected to a hardening treatment by heating or exposing to light after unevenness is formed by the laser engraving (a post-crosslinking treatment). It is also possible that a hardening treatment (a crosslinking treatment or a pre-crosslinking treatment) is firstly conducted by means of heating or the like before the laser engraving to make the relief forming layer being hard and then the laser engraving is conducted. The resultant which is previously subjected to a crosslinking treatment may be called a "hard relief forming layer".

When a relief forming layer contains a polymerizable compound and a laser engraving is conducted without performing a crosslinking treatment, a relief layer which is formed therefrom and unevenness has been formed thereon may be called a "relief layer before hardening", and a relief layer which is formed by subjecting the "relief layer before hardening" to a post-crosslinking treatment by applying energy such as heat or light may be called a "relief layer after hardening".

Relief Forming Layer

The relief forming layer contains a binder polymer and a photo-thermal conversion agent as necessary components, and may further contain various compounds such as a polymerizable compound or a plasticizer.

1. Binder Polymer

The binder polymer is a main component which forms the relief forming layer and can be generally selected from a thermoplastic resin, a thermoplastic elastomer, and the like in accordance with the purpose, from the viewpoint of assuring the recording sensitivity to the laser.

For example, in the case of using the binder polymer for the purpose of curing the binder polymer by heating or exposure and enhancing strength, a polymer having carbon-carbon unsaturated bonds in the molecule is selected as the binder polymer. In the case of using the binder polymer for the purpose of forming a pliable film having flexibility, a soft resin or a thermoplastic elastomer is selected as the binder polymer.

It is preferable to use a hydrophilic or alcoholphilic polymer as the binder polymer from the viewpoints of properties of the relief forming layer and the relief layer formed therefrom (specifically from the viewpoints of the ease of preparation of a composition for relief forming layer and an improvement of the resistance to oily ink in the obtained relief printing plate). Also, from the viewpoint of laser engraving sensitivity, a polymer including a partial structure which thermally degrades by exposure or heating, is preferable.

As such, in this invention, binder polymers may be selected in accordance with the purpose, while taking into consideration of the properties according to the applications of the resin composition for laser engraving, and one species or a combination of two or more species of such binder polymers may be used.

Hereinafter, various polymers that may be used as the binder polymers in the invention will be described.

Polymer Having Carbon-carbon Unsaturated Bond

A polymer having carbon-carbon unsaturated bonds in the molecule may be suitably used in the thermoplastic resin, the thermoplastic elastomer and the like. The carbon-carbon unsaturated bonds may be present in either the main chain or the side chains, or may also be present in both of the chains. Hereinafter, the carbon-carbon unsaturated bond may also be simply referred to as an "unsaturated bond", and a carbon-carbon unsaturated bond present at an end of the main chain or side chain may also be referred to as a "polymerizable group".

In the case where the polymer has carbon-carbon unsaturated bonds in the main chain thereof, the polymer may have the unsaturated bonds at one terminal thereof, at both terminals thereof, and/or within the main chain thereof Furthermore, in the case where the polymer has carbon-carbon unsaturated bonds in a side chain thereof, the unsaturated bonds may be directly attached to the main chain, and/or may be attached to the main chain via an appropriate linking group.

Examples of the polymer containing carbon-carbon unsaturated bonds in the main chain include SB (polystyrene-polybutadiene), SBS (polystyrene-polybutadiene-polystyrene), SIS (polystyrene-polyisoprene-polystyrene), SEBS (polystyrene-polyethylene/polybutylene-polystyrene), and the like.

In the case of using a polymer having a highly reactive polymerizable unsaturated group such as a methacryloyl group, as the polymer having carbon-carbon unsaturated bonds in the side chain, a film having very high mechanical strength may be produced. Particularly, highly reactive polymerizable unsaturated groups may be relatively easily introduced into the molecule into polyurethane thermoplastic elastomers and polyester thermoplastic elastomers,.

Any known method may be employed when introduce unsaturated bonds or polymerizable groups into the binder polymer. Examples of the method include: a method of copolymerizing the polymer with a structural unit having a polymerizable group precursor which is formed by attaching a protective group to the polymerizable group, and eliminating the protective group to restore the polymerizable group; and a method of producing a polymer compound having a plurality of reactive groups such as a hydroxyl group, an amino group, an epoxy group, a carboxyl group, an acid anhydride group, a ketone group, a hydrazine residue, an isocyanate group, an isothiacyanate group, a cyclic carbonate group or an ester group, subsequently reacting the polymer compound with a binding agent which has a plurality of groups capable of binding with the reactive group (for example, polyisocyanate and the like for the case of a hydroxyl group or an amino group), to thereby carry out adjustment of the molecular weight and conversion to a bindable group at the chain end, and then reacting this group which is capable of reacting with the terminal bindable group, with an organic compound having a polymerizable unsaturated group, to thus introduce a polymerizable group by means of a polymer reaction. When these methods are used, the amount of introduction of the unsaturated bond or the polymerizable group into the polymer compound may be controlled.

It is also preferable to use the polymer having an unsaturated bond in combination with a polymer which does not have an unsaturated bond. That is, since a polymer obtainable by adding hydrogen to the olefin moiety of the polymer having carbon-carbon unsaturated bonds, or a polymer obtainable by forming a polymer using as a raw material a monomer in which an olefin moiety has been hydrogenated, such as a monomer resulting from hydrogenation of butadiene, isoprene or the like, has excellent compatibility, the polymer may be used in combination with the polymer having unsaturated bonds, so as to regulate the amount of unsaturated bonds possessed by the binder polymer. In the case of using these in combination, the polymer which does not have unsaturated bonds may be used in a proportion of generally 1 parts by mass to 90 parts by mass, and preferably 5 parts by mass to 80 parts by mass, relative to 100 parts by mass of the polymer having unsaturated bonds.

As will be discussed later, in aspects where curability is not required for the binder polymer, such as in the case of using another polymerizable compound in combination, the binder polymer does not necessarily contain an unsaturated bond, and a variety of polymers which do not have unsaturated bonds may be solely used as the binder polymer in the relief forming layer.

Examples of the polymer which does not have unsaturated bonds and can be used in such a case include polyesters, polyamides, polystyrene, acrylic resins, acetal resins, polycarbonates and the like.

The binder polymer suitable for the use in the invention, which may or may not have unsaturated bonds, has a number average molecular weight preferably in the range of from 1000 to 1,000,000, and more preferably in the range of from 5000 to 500,000. When the number average molecular weight of the binder polymer is in the range of 1000 to 1,000,000, the mechanical strength of the film to be formed may be secured. Here, the number average molecular weight is a value measured using gel permeation chromatography (GPC), and reduced with respect to polystyrene standard products with known molecular weights.

Examples of the binder polymer which may be preferably used from the viewpoint of assuring laser engraving sensitivity include a thermoplastic polymer which can be liquefied by being imparted with energy by means of exposure and/or heating, and a polymer having a partial structure which can be decomposed by being imparted with energy by means of exposure and/or heating.

Thermoplastic Polymer and Polymer Having Decomposability

Examples of the polymer having decomposability include those polymers containing, as a monomer unit having in the molecular chain a partial structure which is likely to be decomposed and cleaved, styrene, α-methylstyrene, α-methoxystyrene, acryl esters, methacryl esters, ester compounds other than those described above, ether compounds, nitro compounds, carbonate compounds, carbamoyl compounds, hemiacetal ester compounds, oxyethylene compounds, aliphatic cyclic compounds, and the like.

Among these, polyethers such as polyethylene glycol, polypropylene glycol and polytetraethylene glycol, aliphatic polycarbonates, aliphatic carbamates, polymethyl methacrylate, polystyrene, nitrocellulose, polyoxyethylene, polynorbornene, polycyclohexadiene hydrogenation products, or a polymer having a molecular structure having many branched structures such as dendrimers, may be particularly preferably exemplified in terms of decomposability.

A polymer containing a number of oxygen atoms in the molecular chain is preferable from the viewpoint of decomposability. From this point of view, compounds having a carbonate group, a carbamate group or a methacryl group in the polymer main chain, may be suitably exemplified. For example, a polyester or polyurethane synthesized from a (poly)carbonate diol or a (poly)carbonate dicarboxylic acid as the raw material, a polyamide synthesized from a (poly) carbonate diamine as the raw material, and the like may be exemplified as the examples of polymers having good thermal decomposability These polymers may also be those containing a polymerizable unsaturated group in the main chain or the side chains. Particularly, in the case of a polymer having a reactive functional group such as a hydroxyl group, an amino group or a carboxyl group, it is also easy to introduce a polymerizable unsaturated group into such a thermally decomposable polymer.

The thermoplastic polymer may be an elastomer or a non-elastomer resin, and may be selected according to the purpose of the resin composition for laser engraving of the invention.

Examples of the thermoplastic elastomer include urethane thermoplastic elastomers, ester thermoplastic elastomers, amide thermoplastic elastomers, silicone thermoplastic elastomers and the like. For the purpose of enhancing the laser engraving sensitivity of such a thermoplastic elastomer, an elastomer in which an easily decomposable functional group such as a carbamoyl group or a carbonate group has been introduced into the main chain, may also be used. A thermoplastic polymer may also be used as a mixture with the thermally decomposable polymer.

The thermoplastic elastomer is a material showing rubber elasticity at normal temperature, and the molecular structure includes a soft segment such as polyether or a rubber molecule, and a hard segment which prevents plastic deformation near normal temperature, as vulcanized rubber does. There exist various types of hard segments, such as frozen state, crystalline state, hydrogen bonding and ion bridging. Such thermoplastic elastomers may be suitable in the case of applying the resin composition for laser engraving of the invention to the production of, for example, relief printing plates requiring plasticity, such as flexo plates.

The kind of the thermoplastic elastomer can be selected according to the purpose. For example, in the case where solvent resistance is required, urethane thermoplastic elastomers, ester thermoplastic elastomers, amide thermoplastic elastomers and fluorine thermoplastic elastomers are preferable. In the case where thermal resistance is required, urethane thermoplastic elastomers, olefin thermoplastic elastomers, ester thermoplastic elastomers and fluorine thermoplastic elastomers are preferable.

Examples of the non-elastomeric resin include polyester resins include unsaturated polyester resins, polyamide resins, polyamideimide resins, polyurethane resins, unsaturated polyurethane resins, polysulfone resins, polyethersulfone resins, polyimide resins, polycarbonate resins, all aromatic polyester resins, and hydrophilic polymers containing hydroxyethylene units (for example, polyvinyl alcohol compounds).

Hydrophilic Polymer

A hydrophilic polymer can be used as the binder polymer in view of imparting the resistence against oily inks and the like to the relief layer.

The hydrophilic polymer herein refers to a water-soluble or water-swellable polymer. Specifically, the term "water-soluble" polymer herein refers to a polymer which dissolves in water at 25° C. in a proportion of 5% by mass or more with respect to the total amount of the water-polymer mixture, and the term "water-swellable" polymer herein refers to a polymer which absorbs water and expands such that the polymer does not seem to be dissolved by eye observation, but there is no obvious solid state (powdered state) precipitate when the polymer is added to water at 25° C. in a proportion of 5% by mass with respect to the total amount of the water-polymer mixture.

Examples of the hydrophilic polymer include hydrophilic polymers having a hydroxyethylene unit; polysaccharides having hydrophilic functional groups, including celluloses; acrylic resins having a salt structure with neutralized acidic functional groups, such as sodium polyacrylate, or a salt structure with neutralized amino groups, or an onium structure; polyamide resins or polyester resins having a hydrophilic group such as polyethylene oxide introduced into the molecule; gelatin; and the like.

Examples of the hydrophilic polymer which are preferable from the viewpoint of exhibiting good hydrophilicity include hydrophilic polymers containing hydroxyethylene; celluloses containing a polar group such as an amino group, or a carboxylic acid group/sulfonic acid group/sulfuric acid group or a group having a salt structure obtained by neutralizing one of these groups; acrylic resins containing a polar group such as an amino group, or a carboxylic acid group/sulfonic acid group/sulfuric acid group or a group having a salt structure obtained by neutralizing one of these groups; and polyamide resins.

More preferable examples thereof include hydrophilic polymers containing hydroxyethylene; acrylic resins containing a polar group such as an amino group, or a carboxylic acid group/sulfonic acid group/sulfuric acid group or a group having a salt structure obtained by neutralizing one of these groups; and polyamide resins, while even more preferable examples include polyvinyl alcohols and polyamide resins.

Example of the hydrophilic polymer which are particularly preferable from the viewpoint of having film formability and having resistance to UV ink include a polymer selected from polyvinyl alcohol (PVA) compounds.

Preferable examples of the hydrophilic polymer include PVB and a PVB compound obtained by modifying PVB.

The PVB may be either a homopolymer or a polyvinylbutyral compound.

The content of butyral in the PVB compound is preferably in the range of 30% to 90%, more preferably in the range of 50% to 80%, and particularly preferably in the range of 55% to 78% with respect to the total molar number of the material monomers defined as 100%.

In view of keeping the balance between engraving sensitivity and filming property of the relief forming layer, the molecular weight of PVB and the PVB compound is preferably in the range of 5,000 to 800,000, more preferably in the range of 8,000 to 500,000, and particularly preferably in the range of 10,000 to 300,000 in terms of weight-average molecular weight.

PVB and PVB compounds can be available as a commercial product. Specific examples thereof which are preferable in view of its solubility in alcohol (particularly ethanol) include "ESREC B" series and "ESREC K (KS)" series (both trade names, manufactured by Sekisui Chemical Co., Ltd.), and "DENKA BUTYRAL" series (trade name, manufactured by Denki Kagaku Kogyo). Specific examples which are more preferable in view of its solubility in alcohol (particularly ethanol) include "ESREC B" series (described above) and "DENKA BUTYRAL" series (described above). Further preferable examples include "BL-1", "BL-1H", "BL-2", "BL-5", "BL-S", "BX-L", "BM-S" and "BH-S" of "ESREC B" series (all trade names, manufactured by Sekisui Chemical Co., Ltd.) and "#3000-1", "#3000-2", "#3000-4", "#4000-2", "#6000-C", "#6000-EP", "#6000-DS" and "#6000-AS" of "DENKA BUTYRAL" series (all trade names, manufactured by Denki Kagaku Kogyo).

When the relief forming layer is made into a film using PVB as the binder polymer, relief forming layer is preferably formed by a method including casting a solution in which PVB is dissolved in a solvent and drying the solution in view of improving the flatness and smoothness of the surface of the relief forming layer.

Other preferable examples of the hydrophilic polymer include PVA and a PVA compound formed by modifying PVA.

The scope of the PVA compound herein includes copolymers and polymers containing a hydroxyethylene unit in a proportion of from 0.1% by mole to 100% by mole, preferably 1% by mole to 98% by mole, and more preferably 5% by mole to 95% by mole, as well as modification products thereof.

The monomer for forming a copolymer by being combined with a vinyl alcohol structural unit may be appropriately selected from known copolymerizable monomers.

Particularly preferable examples of modification products of the PVA compound include a vinyl alcohol/vinyl acetate copolymer (partially saponified-polyvinyl alcohol) and modified products thereof.

Among the above, PVA and partially saponified-polyvinyl alcohol are particularly preferable in view of providing filming property to the relief forming layer.

As for the hydrophilic polymer. It is particularly preferable to use one or more selected from PVA compounds and a hydrophilic polymer which does not contain a hydroxyethylene unit (hereinafter, may also be appropriately referred to as "non-PVA compound"), in combination.

The non-PVA compound, which is a hydrophilic polymer that can be used as the binder polymer and is free of a hydroxyethylene unit, is preferably a polymer having a polarity the degree of which is close to that of the PVA compound to an extent that the polymer exhibits compatibility with the PVA compound.

Specific examples of the hydrophilic polymer having polarity which is similar to that of the PVA compound (the non-PVA compound) include: a hydrophilic polyamide obtained by introducing a hydrophilic group such as polyethylene glycol or piperazine, into a non-water-soluble polyamide obtainable by polymerization of adipic acid, 1,6-hexanediamine or F-caprolactam only; the PVB; and the like. Such a hydrophilic polyamide has good compatibility with the PVA compounds, and easily infiltrates between the molecules of PVA compounds, so that the intermolecular force between the two polymers can be decreased and the polymer can be softened as a whole. The combination of the PVA compound and the non-PVA compound is preferable in preparation of a flexo plate.

Examples of the synthesis method for the hydrophilic polyamide include the followings.

When ϵ-caprolactam and/or adipic acid is reacted with a polyethylene glycol modified with amine at both chain ends, polyamide having a polyethylene glycol unit is obtained. When ϵ-caprolactam and/or adipic acid is reacted with piperazine, a hydrophilic polyamide having a piperazine skeleton is obtained.

When an amide group of a hydrophilic polyamide is reacted with an epoxy group of glycidyl methacrylate, a hydrophilic polyamide having a crosslinkable functional group introduced into the polymer molecule is obtained.

Examples of the PVA compound include a polymer in which at least a part of the hydroxyl groups of the hydroxyethylene unit have been modified into carboxyl groups; a polymer in which at least a part of the hydroxyl groups of the hydroxyethylene unit have been modified into (meth)acryloyl groups; a polymer in which at least a part of the hydroxyl groups of the hydroxyethylene unit have been modified into amino groups; a polymer in which ethylene glycol or propylene glycol, or an oligomer thereof has been introduced into at least a part of the hydroxyl groups of the hydroxyethylene unit; and the like.

The polymer in which at least a part of the hydroxyl groups have been modified into carboxyl groups may be obtained by esterifying polyvinyl alcohol or a partially saponified polyvinyl alcohol with a polyfunctional carboxylic acid such as, for example, succinic acid, maleic acid or adipic acid. The amount of introduction of carboxyl groups into the polymer is preferably 0.01 mole to 1.00 mole, and more preferably 0.05 mole to 0.80 moles, relative to 1 mole of the hydroxyl groups.

The polymer in which at least a part of the hydroxyl groups have been modified into (meth)acryloyl groups, may be obtained by adding glycidyl(meth)acrylate to the above-mentioned carboxyl group-modified polymer, or by esterifying polyvinyl alcohol or a partially saponified polyvinyl alcohol with (meth)acrylic acid. The amount of introduction of (meth)acryloyl groups into the polymer is preferably 0.01 mole to 1.00 mole, and more preferably 0.03 mole to 0.50 moles, relative to 1 mole of the hydroxyl groups. Here, the expression "(meth)acryloyl group" is used to collectively refer to acryloyl group and/or methacryloyl group. Also, the expression "(meth)acrylate" is used to collectively refer to acrylate and/or methacrylate. The same applies to the expression "(meth)acrylic acid".

The polymer in which at least a part of the hydroxyl groups have been modified into amino groups may be obtained by esterifying polyvinyl alcohol or a partially saponified polyvinyl alcohol with a carboxylic acid containing an amino group such as carbamic acid. The amount of introduction of amino groups into the polymer is preferably 0.01 mole to 1.00 mole, more preferably 0.05 mole to 0.70 moles, relative to 1 mole of the hydroxyl groups.

The polymer in which ethylene glycol or propylene glycol, or an oligomer thereof has been introduced into at least a part of the hydroxyl groups, may be obtained by heating polyvinyl alcohol or a partially saponified polyvinyl alcohol and a glycol in the presence of catalytic sulfuric acid, and removing water, which is a side product, out of the reaction system. The total amount of introduction of ethylene glycol or propylene glycol, or an oligomer thereof into the polymer is preferably 0.01 mole to 0.90 moles, and more preferably 0.03 mole to 0.50 moles, relative to 1 mole of the hydroxyl groups.

Among the modification products of the PVA compounds, the polymer in which at least a part of hydroxyl groups have been modified into (meth)acryloyl groups can be particularly preferably used. It is because, by directly introducing an unreacted crosslinkable functional group into the hydrophilic polymer, the strength of the relief forming layer may be enhanced, without using a large amount of a polyfunctional monomer as the ethylenic unsaturated monomer, which is described below as a arbitrarily-used polymerizable compound, and therefore both of the flexibility and strength of the relief forming layer can be achieved.

The weight average molecular weight (in terms of polystyrene amount measured by GPC) of the hydrophilic polymer used as the binder polymer is preferably 5,000 to 500,000. When the weight average molecular weight is 5000 or greater, the polymer can be excellent in shape retainability as an elemental resin, while when the weight average molecular weight is 500,000 or less, the polymer can be easily dissolved in a solvent such as water, and can be useful in preparing a resin composition for laser engraving. The weight average molecular weight of the hydrophilic polymer is more preferably 10,000 to 400,000, and particularly preferably 15,000 to 300,000.

The content of the hydrophilic polymer in the relief forming layer is preferably 10% by mass to 90% by mass, and more preferably 15% by mass to 85% by mass, with respect to the total mass of the solid content of the relief forming layer. When the content of the hydrophilic polymer is set to 10% by mass or more, a print durability sufficient can be provided to a relief printing plate resulting therefrom. Also, when the content of the hydrophilic polymer is set to 90% by mass or less, other necessary components can be added to the relief forming layer, which may enable to provide properties of a flexographic printing plate according to the purposes, such as flexibility, can be imparted to a relief printing plate resulting therefrom.

When PVA and/or the PVA compound and a non-PVA compound are used in combination in the relief forming layer, the total content of these is preferably 15% by mass to 90% by mass, and more preferably 15% by mass to 80% by mass, with respect to the total mass of the solid content of the relief forming layer. When the total content of the PVA and/or the PVA compound and non-PVA compound is set to 15% by mass or more, cold flow of the printing plate precursor having thereof can be effectively prevented. When the total content is set to 90% by mass or less, there can be no occurrence of the lack of other components, and a sufficient print durability as a printing plate may be provided to the relief printing plate resulting therefrom.

When PVA and/or the PVA compound and a non-PVA compound are used in combination in the relief forming layer, the content of the PVA and/or the PVA compound is preferably 10% by mass to 90% by mass, and more preferably 15% by mass to 85% by mass, with respect to the total mass of the solid content of the relief forming layer. When the content of the PVA compound and/or the PVA compound is set to 10% by mass or more, a sufficient print durability as a printing plate may be provided to the relief printing plate resulting therefrom. When the content of the PVA compound is set to 85% by mass or less, there can be no occurrence of the lack of other components, and a sufficient flexibility as a flexo printing plate may be provided to the relief printing plate resulting therefrom.

On the other hand, the content of the non-PVA compound is preferably 1% by mass to 15% by mass, and more preferably 3% by mass to 10% by mass, with respect to the total mass of the solid content of the relief forming layer. When the content of the non-PVA compound is set to 1% by mass or more, softening of the PVA compound can be efficiently achieved to provide a sufficient flexibility as a flexo printing plate to the relief printing plate resulting therefrom as well as a sufficient printing durability as the relief printing plate resulting therefrom. When the content of the non-PVA compound is set to 15% by mass or less, the amount of generation of tacky engraving remnants, which is formed from the non-PVA compound, may be reduced.

It is preferable to use the PVA and/or the PVA compound are used in combination with the non-PVA compound from the viewpoint of securing the appropriate properties required to printing plate such as flexibility or abrasion resistance of the film. A single kind of the PVA and/or the PVA compound can be used in combination with a single kind of the non-PVA compound. A plurality of any one of these may be used in combination. A plurality of kinds of the PVA and/or the PVA compound and a plurality of kinds of the non-PVA compound may be used in combination.

When a hydrophilic polymer is used, the engraving remnant which may be formed therefrom is also hydrophilic, and consequently, the engraving remnants can be removed by a simple operation of washing away with tap water after the engraving process. If a hydrophobic polymer such as SB (polystyrene-polybutadiene), SBS (polystyrene-polybutadiene-polystyrene), SIS (polystyrene-polyisoprene-polystyrene) or SEBS (polystyrene-polyethylene/polybutylene-polystyrene), or an elastomer, polyurethane or an acrylic resin is used as the binder that is a main component of the relief forming layer, the engraving remnant formed therefrom is hydrophobic, and thus an instance where the removal of the engraving remnant by washing away with is difficult may occur.

PVA and/or the PVA compound can be preferably used as the hydrophilic polymer (particularly, one having a glass transition temperature higher than or equal to room temperature) since the phenomenon of edge fusion of the relief at the time of engraving, which is caused by low glass transition temperature, tends to be suppressed as compared to the above-mentioned hydrophobic polymers or elastomers (mostly having a glass transition temperature lower than or equal to room temperature).

The hydrophilic polymer may also be used in combination with a relatively hydrophobic binder polymer as described above. Polymers including the monomers shown below as a component of polymerization or copolymerization can be used as the relatively hydrophobic binder polymer so as to adjust the properties such as the film hardness or flexibility at the time of film formation, and compatibility with other components such as co-present polymerizable compounds or initiator.

Compounds having only one ethylenic unsaturated bond, such as: (meth)acrylates having a hydroxyl group, such as 2-hydroxyethyl(meth)acrylate, 2-hydroxypropyl(meth)acrylate, 2-hydroxybutyl(meth)acrylate, 3-chloro-2-hydroxypropyl(meth)acrylate and β-hydroxy-β'-(meth)acryloyloxyethyl phthalate; alkyl(meth)acrylates such as methyl(meth)acrylate, ethyl(meth)acrylate, propyl(meth)acrylate, butyl(meth)acrylate, isoamyl(meth)acrylate, 2-ethylhexyl(meth)acrylate, lauryl(meth)acrylate and stearyl(meth)acrylate; cycloalkyl(meth)acrylates such as cyclohexyl(meth)acrylate; halogenated alkyl(meth)acrylates such as chloroethyl(meth)acrylate and chloropropyl(meth)acrylate; alkoxyalkyl(meth)acrylates such as methoxyethyl(meth)acrylate, ethoxyethyl(meth)acrylate and butoxyethyl(meth)acrylate; phenoxyalkyl(meth)acrylates such as phenoxyethyl acrylate and nonylphenoxyethyl(meth)acrylate; alkoxyalkylene glycol(meth)acrylate such as ethoxydiethylene glycol(meth)acrylate, methoxytriethylene glycol(meth)acrylate and methoxydipropylene glycol(meth)acrylate; (meth)acrylamides such as (meth)acrylamide, diacetone(meth)acrylamide, and N,N'-methylenebis(meth)acrylamide; 2,2-dimethylaminoethyl(meth)acrylate, 2,2-diethylaminoethyl(meth)acrylate, N,N-dimethylaminoethyl(meth)acrylamide and N,N-dimethylaminopropyl(meth)acrylamide; compounds having two or more ethylenic unsaturated bonds, such as: di(meth)acrylate of polyethylene glycol, such as diethylene glycol di(meth)acrylate; polypropylene glycol di(meth)acrylate such as dipropylene glycol di(meth)acrylate; trimethylolpropane tri(meth)acrylate, pentaerythritol tri(meth)acrylate, pentaerythritol tetra(meth)acrylate, glycerol tri(meth)acrylate; polyvalent(meth)acrylates obtainable by subjecting a compound having an ethylenic unsaturated bond and active hydrogen, such as an unsaturated carboxylic acid or unsaturated alcohol, to addition reaction to ethylene glycol diglycidyl ether; polyvalent(meth)acrylates obtainable by subjecting an unsaturated epoxy compound such as glycidyl(meth) acrylate, and a compound having active hydrogen, such as a carboxylic acid or an amine, to addition reaction; polyvalent (meth)acrylamides such as methylenebis(meth)acrylamide; polyvalent vinyl compounds such as divinylbenzene; and the like may be mentioned. According to the invention, these may be used individually alone, or in combination of two or more species.

Examples of the monomer of the polymerization component which is preferable from the viewpoint of film formability include alkoxyalkylene glycol(meth)acrylates such as 2-hydroxyethyl(meth)acrylate, 2-hydroxypropyl(meth)acrylate, 2-hydroxybutyl(meth)acrylate, ethoxydiethylene glycol (meth)acrylate, methoxytriethylene glycol(meth)acrylate and methoxydipropylene glycol(meth)acrylate; (meth)acrylamide, diacetone(meth)acrylamide, cyclohexyl(meth)acrylate, benzyl(meth)acrylate, and N-acryloylmorpholine are preferable. Among these, acrylates are particularly preferable from the viewpoint of securing the flexibility of the obtainable polymers.

In addition to these, examples the polymer which may be used in combination as the hydrophilic polymer further include the following polymers.

A polymer containing at least either an olefin or a carbon-carbon triple bond in the main chain may be mentioned, and examples thereof include SB (polystyrene-polybutadiene), SBS (polystyrene-polybutadiene-polystyrene), SIS (polystyrene-polyisoprene-polystyrene), SEBS (polystyrene-polyethylene/polybutylene-polystyrene), which are raised as the polymer having a carbon-carbon double bond.

A hydrophobic polymer which may be used in combination with the hydrophilic polymer is preferably contained to the extent to enhance the film property of the relief forming layer without decreasing the engraving sensitivity, and the content of the hydrophobic polymer is preferably 1% by mass to 50% by mass, more preferably 1% by mass to 30% by mass, and most preferably 1% by mass to 10% by mass, with respect to the total amount of the binder polymer.

The content of the binder polymer in the relief forming layer according to the invention is preferably 10% to 90% by mass, and more preferably 20% to 85% by mass, with respect to the total mass of solids in the relief forming layer. In consideration of relationships to other effective components, the content of the binder polymer is preferably not more than 85% by mass. When the content of the binder polymer is within the above range, a cold flow of the relief forming layer can be suppressed and the relief forming layer can be formed to have a practically sufficient printing resistance.

2. Photo-thermal Conversion Agent

The relief forming layer of the precursor of the invention contains a photo-thermal conversion agent for the purpose of enhancing the laser engraving sensitivity. It is preferable in view of improving a photo-thermal conversion efficiency that a maximum absorption wavelength of the photo-thermal conversion agent used in the invention is substantially the same as the wavelength of laser used for the image formation (laser engraving). Since a semiconductor laser which is equipped with a fiber and emits laser with wavelength of 700 nm to 1,300 nm is used for the image formation, it is preferable that the photo-thermal conversion agent contains one or more selected from dyes and pigments, a maximum absorption wavelength of each of which is within the range of 700 nm to 1,300 nm. In view of preferable sensitivity and, stability of the relief forming layer, it is more preferable that the photo-thermal conversion agent is a pigment having an absorption wavelength at least in the range of 800 nm to 1,200 nm, and it is further preferable that the photo-thermal conversion agent is a pigment having a maximum absorption wavelength within the range of 800 nm to 1,200 nm.

Commercially available dyes and known dyes that are described in literatures such as "Handbook of Dyes" (edited by the Society of Synthetic Organic Chemistry, Japan, 1970), may be used as for the dye. Specific examples thereof include azo dyes, metal complex azo dyes, pyrazolone azo dyes, naphthoquinone dyes, anthraquinone dyes, phthalocyanine dyes, carbonium dyes, diimmonium compounds, quinonimine dyes, methine dyes, cyanine dyes, squarylium colorants, pyrylium salts, and metal thiolate complexes.

Preferable examples of the dye include the cyanine dyes described in JP-A Nos. 58-125246, 59-84356, 59-202829, 60-78787 and the like; the methine dyes described in JP-A Nos. 58-173696, 58-181690, 58-194595, and the like; the naphthoquinone dyes described in JP-A Nos. 58-112793, 58-224793, 59-48187, 59-73996, 60-52940, 60-63744 and the like; the squarylium colorants described in JP-A No. 58-112792 and the like; the cyanine dyes described in U.K. Patent No. 434,875; and the like.

Preferable examples of the dye further include the near-infrared absorption sensitizers described in U.S. Pat. No. 5,156,938, the substituted arylbenzo(thio)pyrylium salts described in U.S. Pat. No. 3,881,924; the trimethinethiapyrylium salts described in JP-A No. 57-142645 (U.S. Pat. No. 4,327,169); the pyrylium-compounds described in JP-A Nos. 58-181051, 58-220143, 59-41363, 59-84248, 59-84249, 59-146063 and 59-146061; the cyanine dyes described in JP-A No. 59-216146; the pentamethinethiopyrylium salts and the like described in U.S. Pat. No. 4,283,475; and the pyrylium compounds described in JP-B Nos. 5-13514 and 5-19702. Preferable examples of the dye furthermore include the near-infrared absorption dyes represented by formulae (I) and (II) in U.S. Pat. No. 4,756,993.

Preferable examples of the photo-thermal conversion agent of the invention include the specific indolenine cyanine colorants described in JP-A No. 2002-278057.

Particularly preferable examples among these dyes include cyanine colorants, squarylium colorants, pyrylium salts, nickel thiolate complexes, and indolenine cyanine colorants. Cyanine colorants or indolenine cyanine colorants are even more preferable.

Specific examples of the cyanine colorants which may be suitably used in the invention include those described in paragraphs [0017] to [0019] of JP-A No. 2001-133969, paragraphs [0012] to [0038] of JP-A No. 2002-40638, and paragraphs [0012] to [0023]of JP-A No. 2002-23360.

The colorants represented by following Formula (d) or Formula (e) are preferable from the viewpoint of photo-thermal conversion property.

(d)

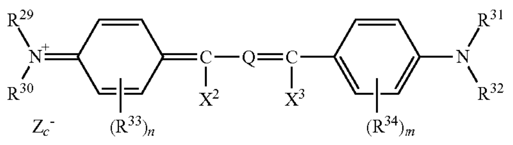

In Formula (d), $R^{29}$ to $R^{31}$ each independently represent a hydrogen atom, an alkyl group or an aryl group; $R^{33}$ and $R^{34}$ each independently represent an alkyl group, a substituted oxy group, or a halogen atom; n and m each independently represent an integer from 0 to 4; $R^{29}$ and $R^{30}$, or $R^{31}$ and $R^{32}$ may be respectively be bound to each other to form a ring, and $R^{29}$ and/or $R^{30}$ may be bound to $R^{33}$, and $R^{31}$ and/or $R^{32}$ may be bound to $R^{34}$, to respectively form a ring; if a plurality of $R^{33}$ or $R^{34}$ are present, $R^{33}$'s or $R^{34}$'s may be bound to each other to form a ring; $X^2$ and $X^3$ each independently represent a hydrogen atom, an alkyl group or an aryl group, and at least one of $X^2$ and $X^3$ represents a hydrogen atom or an alkyl group; Q represents a trimethine group or pentamethine group which may be substituted, and may form a cyclic structure together with a divalent organic group; and $Zc^-$ represents a counter-anion. However, if the colorant represented by formula (d) has an anionic substituent in the structure and does not require charge neutralization, $Za^-$ is not necessary. Preferably, $Za^-$ is a halogen ion, a perchloric acid ion, a tetrafluoroborate ion, a hexafluorophosphate ion or a sulfonic acid ion, from the viewpoint of the storage stability of the photosensitive layer coating solution, and particularly preferably, $Za^-$ is a perchloric acid ion, a hexafluorophosphate ion or an arylsulfonic acid ion.

Specific examples of the dyes represented by Formula (d), which may be suitably used in the invention, include those shown below.

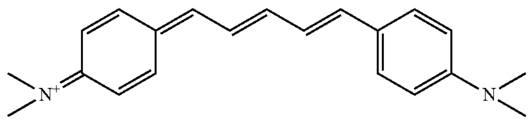

$ClO_4^-$

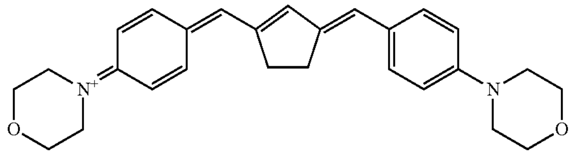

$BF_4^-$

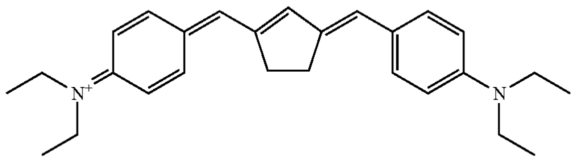

$PF_6^-$

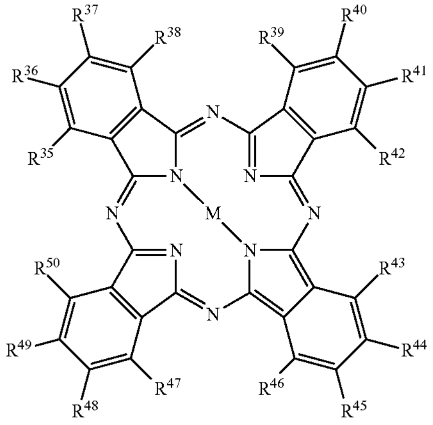

(e)

In Formula (e), $R^{35}$ to $R^{50}$ each independently represent a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure, and if it is possible to introduce substituents to these groups, the groups may be substituted; M represents two hydrogen atoms or metal atoms, a halo-metal group, or an oxy-metal group, and as the metal atoms included therein, there may be mentioned the atoms of Groups IA, IIA, IIIB and IVB of the Period Table of Elements, the first-row, second-row and third-row transition metals, and lanthanoid elements. Among them, copper, magnesium, iron, zinc, cobalt, aluminum, titanium and vanadium are preferable.

Specific examples of the dyes represented by Formula (e), which may be suitably used in the invention, include those shown below.

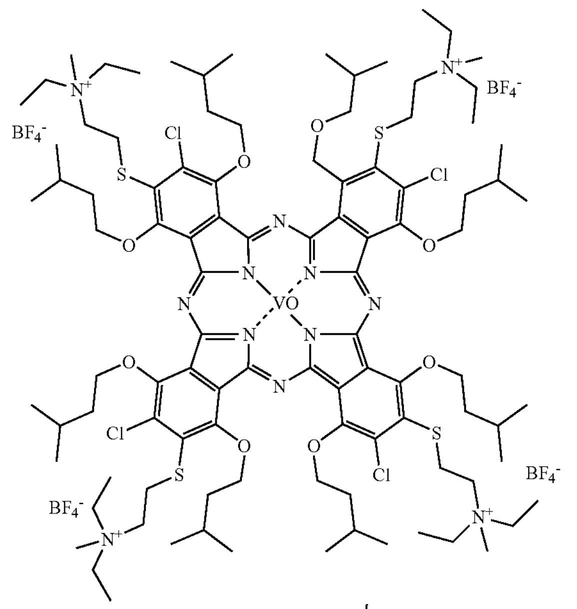

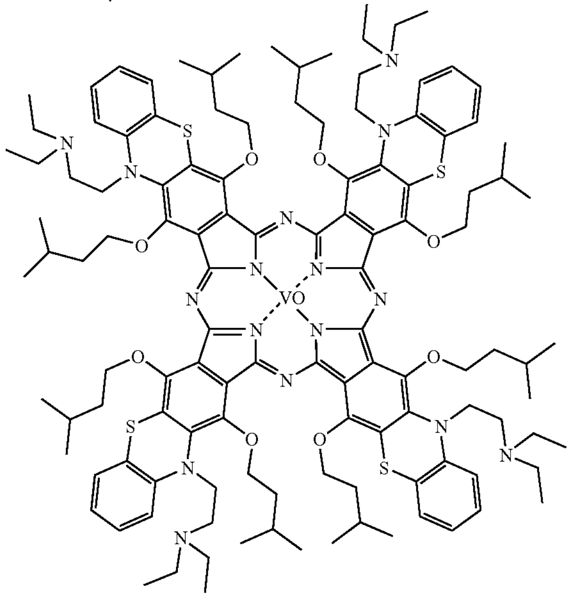

As the pigments which may be used in the invention, commercially available pigments, and the pigments described in the Color Index (C.I.) Handbook, "Handbook of New Pigments" (edited by Japan Association of Pigment Technology, 1977), "New Pigment Application Technology" (published by CMC, Inc., 1986), and "Printing Ink Technology" (published by CMC, 1984), may be used.

Examples of the pigments include black pigments, yellow pigments, orange pigments, brown pigments, red pigments, magenta pigments, blue pigments, green pigments, fluorescent pigments, metal powder pigments, and other polymer-bound pigments. Specifically, insoluble azo pigments, azo lake pigments, condensed azo pigments, chelate azo pigments, phthalocyanine pigments, anthraquinone pigments, perylene- and perinone pigments, thio indigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, carbon black, and the like may be used. Among these pigments, carbon black is preferable.

These pigments may be used without being subjected to a surface treatment, or may be used after being subjected to a surface treatment. Examples of a method of the surface treatment include a method of coating the pigment surface with resin or wax, a method of adhering surfactants to the pigment surface, a method of binding a reactive substance (for example, a silane coupling agent, an epoxy compound, polyisocyanate, or the like) to the pigment surface, and the like. These surface treatment methods are described in "Properties and Applications of Metal Soaps" (published by Saiwai Shobo Co., Ltd.), "Printing Ink Technology" (published by CMC, Inc., 1984), and "New Pigment Application Technology" (published by CMC, Inc., 1986).

The particle size of the pigment is preferably in the range of 0.01 μm to 10 μm, more preferably in the range of 0.05 μm to 1 μm, and particularly preferably in the range of 0.1 μm to 1 μm. When the particle size of the pigment is 0.01 μm or larger, the dispersion stability of the pigment in the coating solution can be increased. Also, when the particle size is 10 μm or less, the uniformity of the layer formed from the resin composition can be improved.

Any known dispersing technologies that are used in the production of ink or in the production of toner may be used as the method for dispersing the pigment. Examples of the dispersing instrument used in the dispersing include an ultrasonic dispersing machine, a sand mill, an attritor, a pearl mill, a super mill, a ball mill, an impeller, a disperser, a KD mill, a colloid mill, Dynatron, a triple-roll mill, a pressurized kneader, and the like. Details are described in "New Pigment Application Technology" (published by CMC, Inc., 1986).

In embodiments, the photo-thermal conversion agent used in the invention is at least one selected from cyanine compounds and phthalocyanine compounds, which are preferable from the viewpoint of high engraving sensitivity. The engraving sensitivity tends to be further increased and is thus preferable when at least one of these photo-thermal conversion agents are used in a combination under a condition that the thermal decomposition temperature of the photo-thermal conversion agent is equal to or higher than the thermal decomposition temperature of a hydrophilic polymer which is suitable as the binder polymer.

Specific examples of the photo-thermal conversion agent that may be used in the invention include cyanine colorants such as heptamethine cyanine colorants, oxonol colorants such as pentamethine oxonol colorants, indolium colorants, benzindolium colorants, benzothiazolium colorants, quinolinium colorants, phthalide compounds reacted with a color developing agent, and the like. It is remarked that not all cyanine colorants necessarily have the above-described photo-absorption properties. Photo-absorption properties of colorants greatly vary depending on the type and the intramolecular position of the substituent, the number of conjugate bonds, the type of counterion, the surrounding environment around the colorant molecule, or the like.

Commercially available laser colorants, hypersaturated absorption colorants, and near-infrared absorption colorants may also be used. Examples of the laser colorants include "ADS740PP", "ADS745HT", "ADS760MP", "AD S740WS", "ADS765WS", "ADS745HO", "ADS790NH" and "ADS800NH" (all trade names, manufactured by American Dye Source, Inc. (Canada)); and "NK-3555", "NK-3509" and "NK-3519" (all trade names, manufactured by Hayashibara Biochemical Labs, Inc.). Examples of the near-infrared absorption colorants include "ADS775MI", "ADS775MP", "ADS775HI", "ADS775PI", "ADS775PP", "ADS780MT", "ADS780BP", "ADS793EI", "ADS798MI", "ADS798MP", "ADS800AT", "ADS805PI", "ADS805PP", "ADS805PA", "ADS805PF", "ADS812MI", "ADS815EI", "ADS818HI", "ADS818HT", "ADS822MT", "ADS830AT", "ADS838MT", "ADS840MT", "ADS845BI", "ADS905AM", "ADS956BI", "ADS 1040T", "ADS 1040P", "ADS 1045P", "ADS1050P", "ADS1060A", "ADS1065A", "ADS1065P", "ADS1100T", "ADS1120F", "ADS1120P", "ADS780WS", "ADS785WS", "ADS790WS", "ADS805WS", "ADS820WS", "ADS830WS", "ADS850WS", "ADS780HO", "ADS810CO", "ADS820HO", "ADS821NH", "ADS840NH", "ADS880MC", "ADS890MC" and "ADS920MC" (all trade names, manufactured by American Dye Source, Inc. (Canada)); "YKR-2200", "YKR-2081", "YKR-2900", "YKR-2100" and "YKR-3071" (all trade names, manufactured by Yamamoto Chemical Industry Co., Ltd.); "SDO-1000B" (trade name, manufactured by Arimoto Chemical Co., Ltd.); and "NK-3508" and "NKX-114" (both trade names, manufactured by Hayashibara Biochemical Labs, Inc.), while the examples are not intended to be limited to these.

Those described in Japanese Patent No. 3271226 may be used as the phthalide compound reacted with a color developing agent. Phosphoric acid ester metal compounds, for example, the complexes of a phosphoric acid ester and a copper salt described in JP-A No. 6-345820 and WO 99/10354, may also be used as the photo-thermal conversion agent. Further, ultramicroparticles having light absorption characteristics in the near-infrared region, and having a number average particle size of preferably 0.3 μm or less, more preferably 0.1 μm or less, and even more preferably 0.08 μm or less, may also be used as the photo-thermal conversion agent. Examples thereof include metal oxides such as yttrium oxide, tin oxide and/or indium oxide, copper oxide or iron oxide, and metals such as gold, silver, palladium or platinum. Also, compounds obtained by adding metal ions such as the ions of copper, tin, indium, yttrium, chromium, cobalt, titanium, nickel, vanadium and rare earth elements, into microparticles made of glass or the like, which have a number average particle size of 5 μm or less, and more preferably 1 μm or less, may also be used as the photo-thermal conversion agent.

In the case that the colorant or the metal compound may react with a component contained in the relief forming layer and causes a change in its maximum absorption wavelength of light absorption, the colorant or the metal compound may be encapsulated in microcapsules. In that case, the number average particle size of the capsules is preferably 10 μm or less, more preferably 5 μm or less, and even more preferably 1 mm or less. Compounds obtained by adsorbing metal ions of copper, tin, indium, yttrium, rare earth elements or the like on ion-exchanged microparticles, may also be used as the photo-thermal conversion agent. The ion-exchanged microparticles may be any of organic resin microparticles or inorganic microparticles. Examples of the inorganic microparticles include amorphous zirconium phosphate, amorphous zirconium phosphosilicate, amorphous zirconium hexametaphosphate, lamellar zirconium phosphate, reticulated zirconium phosphate, zirconium tungstate, zeolites and the like. Examples of the organic resin microparticles include generally used ion-exchange resins, ion-exchange celluloses, and the like.

Preferable examples of the photo-thermal conversion agent is carbon black in view of its stability and efficiency in photo-thermal conversion.

Any kind of the carbon black may be used as long as the carbon black has stable dispersibility or the like in the composition which forms the relief forming layer. The carbon black may be a product classified according to American Society for Testing and Materials (ASTM) standard or may be those usually used in various applications such as coloring, rubber making, or batteries.

Examples of the carbon black include furnace black, thermal black, channel black, lamp black, acetylene black, and the like. In addition, black-colored colorants such as carbon black may be used in the form of color chips or color pastes, in which the colorants have been dispersed in advance in nitrocellulose, a binder or the like, to prepare the composition for forming the relief forming layer, using a dispersant which facilitates dispersing the ships or pastes in the composition if necessary. Such chips or pastes can be easily obtained as commercially available products.

The range of the carbon black which can be used in the invention is wide to include a carbon black having a relatively low specific surface area and a relatively low DBP absorption as well as a micronized carbon black having a large specific surface area.

Suitable examples of the carbon black include PRINTEX U, PRINTEX A, and SPEZIALSCHWARZ 4 (all registered trademarks, manufactured by Degussa GmbH), SEAST 600 ISAF-LS (trade name, manufactured by Tokai Carbon Co., Ltd.), and ASAHI#70 (N-300) (trade name, manufactured by Asahi Carbon Co,Ltd.).

In the invention, the photo-thermal conversion agent is preferably a carbon black with an oil absorbing amount of less than 150 ml/100 g in view of improving dispersibility in an application solution for forming a relief forming layer.

Upon the selection of the carbon black as described above, “Handbook of Carbon Black” edited by Carbon Black Association or the like can be referred to.

A carbon black having an oil absorbing amount of less than 150 ml/100 g may exhibit a good dispersibility in the relief forming layer. On the other hand, when a carbon black having an oil absorbing amount of 150 ml/100 g or more is used, dispersibility in an application solution for forming a relief forming layer tends to be deteriorated and aggregation of carbon black may tend to occur, whereby lack of uniformity in sensitivity of the relief forming layer or the like may occur. In addition, enhancing of dispersing of carbon black may be required in preparing the application solution for prevention of the aggregation, which may lead to decrease in freeness in the formulation of the application solution.

The content of the photo-thermal conversion agent in the composition for forming the relief forming layer i, preferably in the range of 0.01% by mass to 20% by mass, more preferably in the range of 0.05% by mass to 10% by mass, and particularly preferably in the range of 0.1% by mass to 5% by mass, with respect to the total mass of the solid content of the resin composition.

In addition to the binder polymer and the photo-thermal conversion agent, the relief forming layer of the precursor of the invention may further contains various compounds according to the purposes.

In view of improving the printing durability of the relief layer formed from the relief forming layer, the relief forming layer preferably contains a polymerizable compound.

Polymerizable Compound

The “polymerizable compound” used in the invention refers to a compound which has at least one carbon-carbon unsaturated bond in a molecule thereof and can be polymerized and cured by a radical which is an initiating species generated by application of light, heat or energy.

Examples of the polymerizable compound that can be preferably used in the invention include an addition polymerizable compound having at least one ethylenic unsaturated double bond. This addition polymerizable compound is preferably selected from compounds having at least one, preferably two or more, terminal ethylenic unsaturated bonds. The family of such compounds is widely known in the pertinent industrial field, and these compounds may be used in the invention without any particular limitations. These compounds respectively have a chemical form such as a monomer, a prepolymer such as a dimer or a trimer, an oligomer, a copolymer thereof, or a mixture of any of these.

Examples of the monomer include unsaturated carboxylic acids (for example, acrylic acid, methacrylic acid, itaconic acid, crotonic acid, isocrotonic acid, maleic acid, and the like), esters thereof, and amides thereof Preferable examples thereof include esters of an unsaturated carboxylic acid and an aliphatic polyhydric alcohol compound and amides of an unsaturated carboxylic acid and an aliphatic polyvalent amine compound. Further, unsaturated carboxylic acid esters having a nucleophilic substituent such as a hydroxyl group, an amino group or a mercapto group; adducts of an amide with a monofunctional or polyfunctional isocyanate or an epoxy compound; dehydration condensation reaction products of an amide with a monofunctional or polyfunctional carboxylic acid, and the like may also be suitably used. Unsaturated carboxylic acid esters having an electrophilic substituent such as an isocyanate group or an epoxy group; adducts of an amide with a monofunctional or polyfunctional alcohol, an amine or a thiol; unsaturated carboxylic acid esters having a detachable substituent such as a halogen group or a tosyloxy group; substitution reaction products of an amide with a monofunctional or polyfunctional alcohol, an amine or a thiol, are also suitable. A family of compounds formed by modifying the above-described compounds by introducing an unsaturated phosphonic acid, styrene, vinyl ether or the like in please of the unsaturated carboxylic acid may also be used.

Specific examples of the ester monomer of an aliphatic polyhydric alcohol compound and an unsaturated carboxylic acid include, as acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyelne glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and the like.

Specific examples of the ester monomer further include, as methacrylic acid esters, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane, bis[p-(methacryloxyethoxy)phenyl] dimethylmethane, and the like.

Specific examples of the ester monomer further include, as itaconic acid esters, ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like.

Specific examples of the ester monomer further include, as crotonic acid esters, ethylene glycol dicrotonate, tetramethylene glycol dicrotonate, pentaerythritol dicrotonate, sorbitol tetracrotonate, and the like.

Specific examples of the ester monomer further include, as isocrotonic acid esters, e ethylene glycol diisocrotonate, pentaerythritol diisocrotonate, sorbitol tetraisocrotonate, and the like.

Specific examples of the ester monomer further include, as maleic acid esters, ethylene glycol dimaleate, triethylene glycol dimaleate, pentaerythritol dimaleate, sorbitol tetramaleate, and the like.

Specific examples of the ester monomer further include the aliphatic alcohol esters as described in Japanese Patent Application Publication (JP-B) Nos. 46-27926 and 51-47334, and JP-A No. 57-196231; the esters having an aromatic skeleton as described in JP-A Nos. 59-5240, 59-5241 and 2-226149; the esters containing an amino group as described in JP-A No. 1-165613; and the like.

Any of the ester monomers may also be used in combination as a mixture.

Specific examples of the amide monomer of an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylenebisacrylamide, xylenebismethacrylamide, and the like.

Specific examples of the amide monomer further include the amides having a cyclohexylene structure as described in JP-B No. 54-21726.

Examples of the addition polymerizable compound which can be preferably used in the invention further include urethane-based addition polymerizable compounds that are produced using an addition reaction of an isocyanate and a hydroxyl group. Specific examples thereof include the vinylurethane compound containing two or more polymerizable vinyl groups in one molecule as described in JP-B No. 48-41708, which is obtained by adding a vinyl monomer containing a hydroxyl group represented by following Formula (V), to a polyisocyanate compound having two or more isocyanate groups in one molecule, and the like.

$$CH_2{=}C(R)COOCH_2CH(R')OH \qquad (V)$$

In Formula (V), R and R' each independently represent H or $CH_3$.

The urethane acrylates described in JP-A No.51-37193, JP-B Nos. 2-32293 and 2-16765; and the urethane compounds having an ethylene oxide skeleton as described.in JP-B Nos. 58-49860, 56-17654, 62-39417 and 62-39418 are also suitable as the addition polymerizable compound.

When the addition polymerizable compounds having an amino structure or a sulfide structure in the molecule as described in JP-A Nos. 63-277653, 63-260909 and 1-105238, are used, a curable composition may be obtained in a short time.

Examples of the addition polymerizable compound further include polyester acrylates such as those described in JP-A No. 48-64183, and JP-B Nos. 49-43191 and 52-30490; and polyfunctional acrylates or methacrylates such as epoxy acrylates obtained by reacting an epoxy resin and (meth)acrylic acid. Examples of the addition polymerizable compound further include the specific unsaturated compounds described in JP-B Nos. 46-43946, 1-40337 and 1-40336; the vinylphosphonic acid compounds described in JP-A No. 2-25493; and the like. In certain cases, the structure containing a perfluoroalkyl group as described in JP-A No.61-22048 can be suitably used. The compounds introduced in Journal of the Adhesion Society of Japan, Vol. 20, No. 7, 300-308 (1984) as photocurable monomers and oligomers, may also be used as the addition polymerizable compound.

From the viewpoint of photosensitization speed, the addition polymerizable compound preferably has a structure having a high content of unsaturated groups per molecule, and in many cases, a bi- or higher functional structure is preferable. In order to enhance the strength of the image parts (that is, the strength of the cured film), the addition polymerizable compound preferably has a tri- or higher functional structure. A method of controlling both photosensitivity and strength by using plural compounds having different functionalities and different polymerizable groups (for example, acrylic acid esters, methacrylic acid esters, styrene compounds, or vinyl ether compounds) in combination can be also effective. The addition polymerizable compound can be used in a proportion in the range of preferably 10% by mass to 60% by mass, and more preferably 15% by mass to 40% by mass, based on the non-volatile components in the composition. The addition polymerizable compound may be used individually alone, or may also be used in combination of two or more species thereof.

By using the polymerizable compound, the film properties such as brittleness and flexibility of the relief forming layer may also be adjusted.

Before and/or after laser decomposition process, the resin composition for laser engraving containing the polymerizable compound may be polymerized and cured by means of energy in the form of light, heat or the like.

Specific preferable examples of the polymerizable compound which can be used in the resin composition for laser engraving of the invention are listed in the following, while the examples are not limited to these.

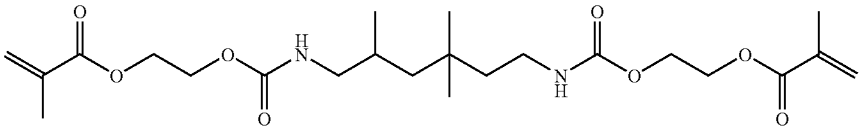

-continued
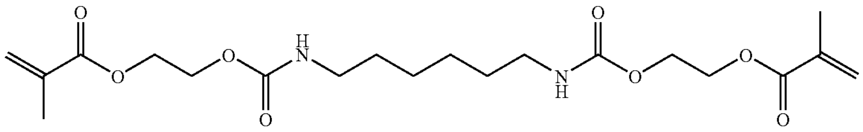
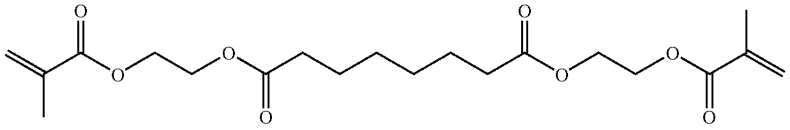
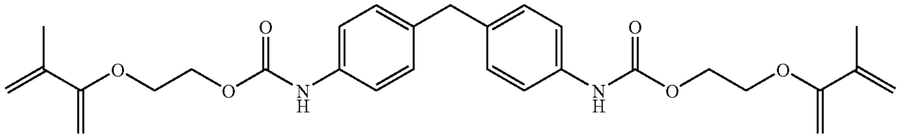
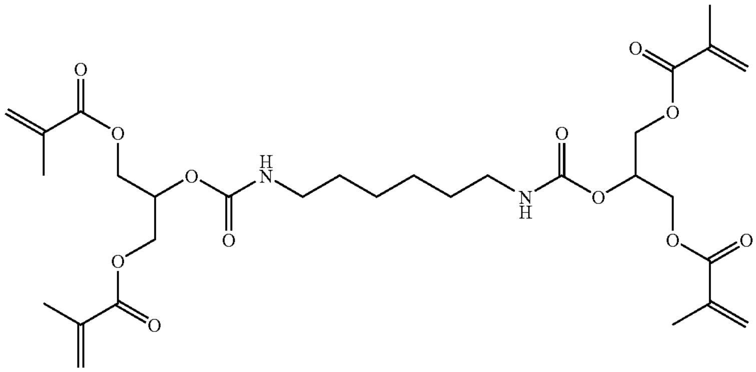
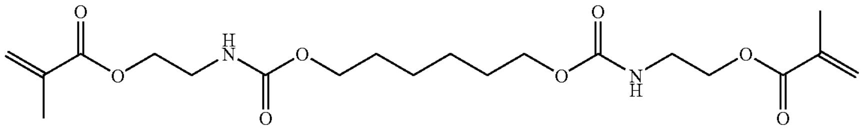
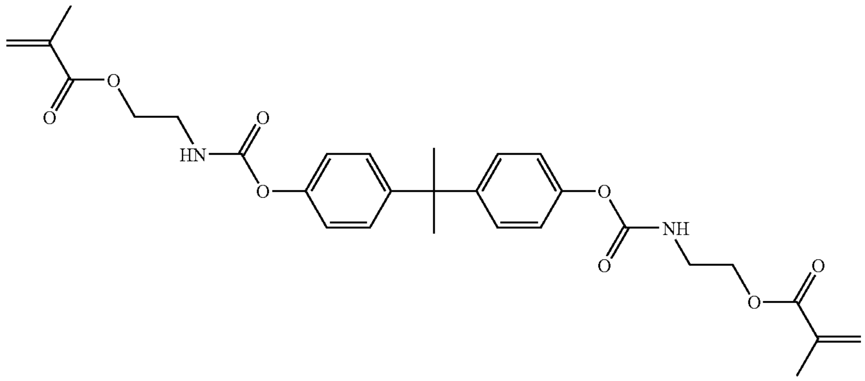
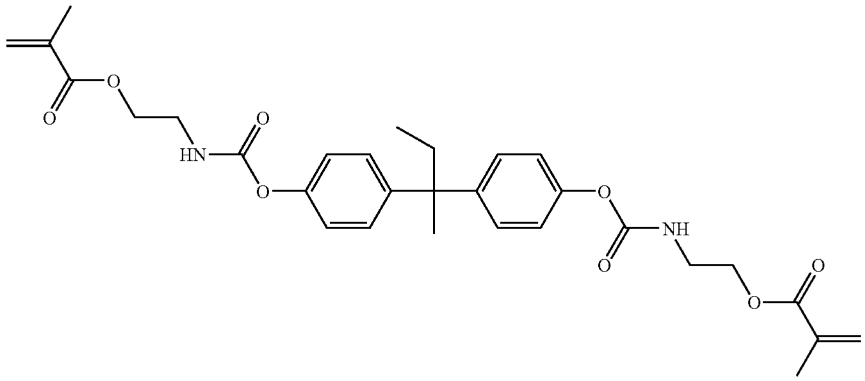 [SMILES: C=C(C)C(=O)OCCNC(=O)Oc1ccc(C(C)(CC)c2ccc(OC(=O)NCCOC(=O)C(=C)C)cc2)cc1]

Among the polymerizable compounds, those containing a sulfur (S) atom are particularly preferable from the viewpoint that edge fusion of a relief formed from the relief forming layer containing thereof may hardly occur and thus provide sharp (well-defined) relief can be easily obtained. That is, the relief forming layer preferably contains a sulfur atom in a crosslinked network therein.

While a polymerizable compound which contains a sulfur atom and a polymerizable compound which does not contain a sulfur atom may also be used in combination, it is preferable to use the polymerizable compound containing a sulfur is singly used from the viewpoint that edge fusion of a relief formed from the relief forming layer containing thereof may hardly occur. A use of plural sulfur-containing polymerizable compounds having different characteristics in combination may contribute to the control of the film flexibility and the like.

Examples of the polymerizable compound containing a sulfur atom include the following compounds.

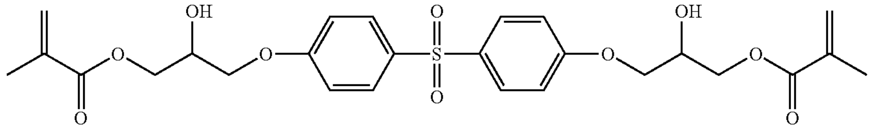

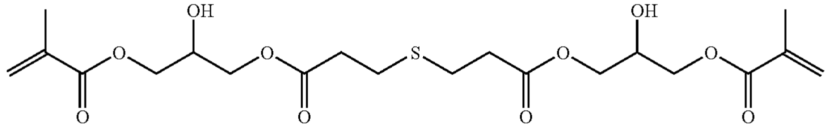

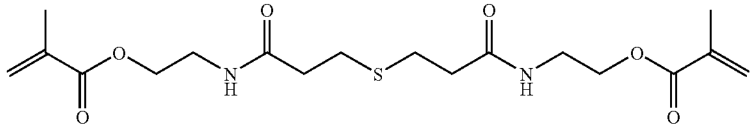

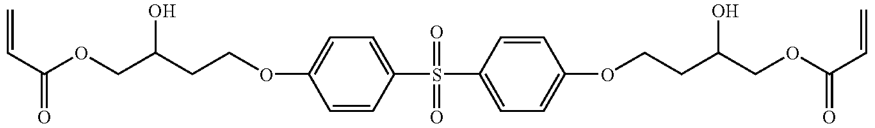

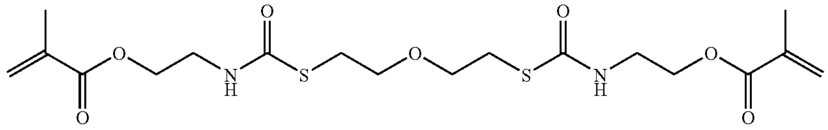

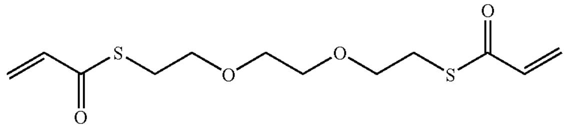

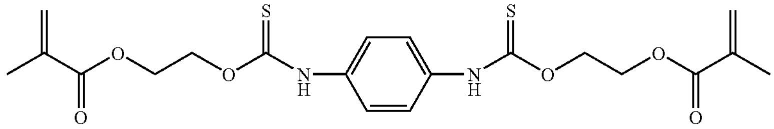

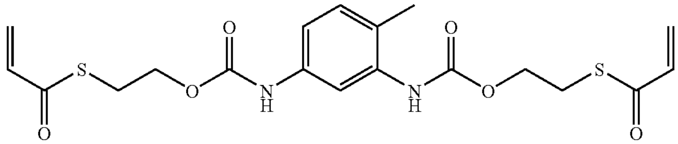

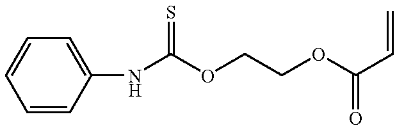

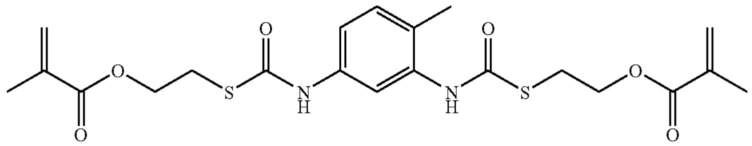

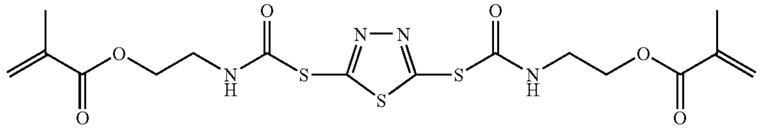

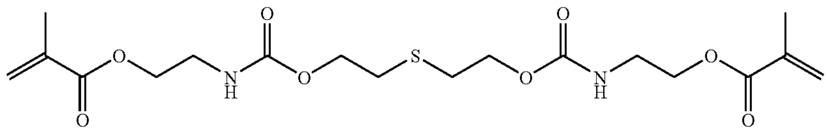

-continued

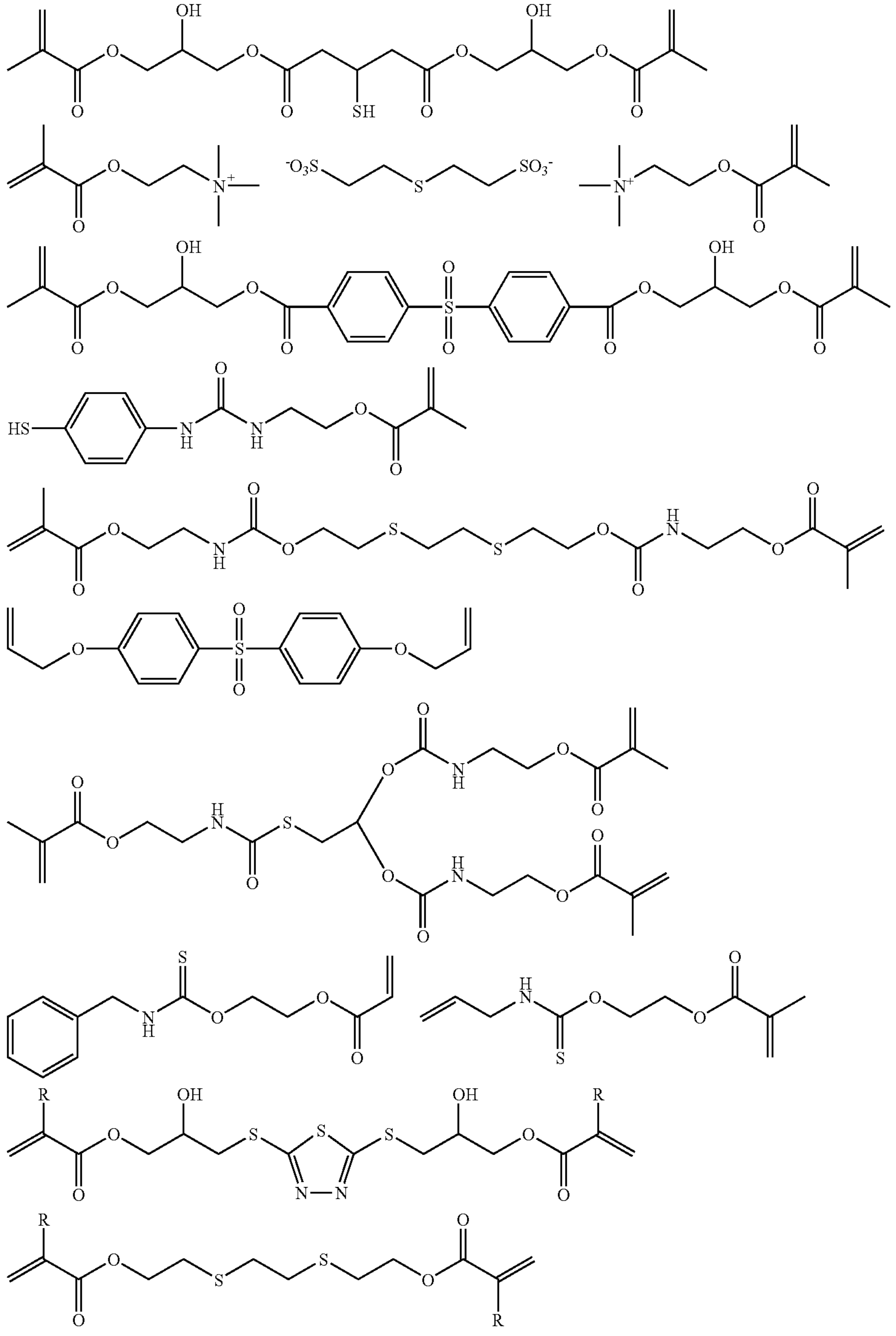

The content of the polymerizable compound in a case where it is added to the relief forming layer is preferably 3% to 60% by mass, and more preferably 5% to 40% by mass with respect to the total mass of the solids in the relief forming layer. Namely, in view of enhancing the printing durability achieved by the addition of the polymerizable compound, the content is preferably 3% by mass or more. When the content is within the above range, the relief forming layer can be prepared as one which may form a relief layer having practically sufficient printing durability and strength.

As to other optional components, the reliefforming layer may further contain a polymerization initiator, a plasticizing agent, a surfactant for improving the properties of the surface formed by application of a solution for forming the relief forming layer, and/or the like depending upon the proposes. Such components will be explained hereinafter.

Polymerization Initiator

Any polymerization initiators that are known to those having ordinary skill in the art may be used in the invention without particular limitation. Specific examples thereof are extensively described in Bruce M. Monroe, et al., Chemical Revue, 93 435 (1993) or R. S. Davidson, Journal of Photochemistry and Biology A: Chemistry, 73, 81 (1993); J. P. Faussier, "Photoinitiated Polymerization—Theory and Applications": Rapra Review Vol. 9, Report, Rapra Technology (1998); M. Tsunooka et al., Prog. Polym. Sci., 21, 1 (1996); and the like. Also known is a family of compounds which oxidatively or reductively cause bond cleavage, such as those described in F. D. Saeva, Topics in Current Chemistry, 156, 59 (1990); G. G. Maslak, Topics in Current Chemistry, 168, 1 (1.993); H. B. Shuster et al., JACS, 112, 6329 (1990); I. D. F. Eaton et al., JACS, 102, 3298 (1980); and the like.

Hereinafter, specific examples of preferable polymerization initiators will be discussed in detail, particularly with regard to a radical polymerization initiator which is a compound capable of generating a radical by the action of photo and/or thermal energy, and initiating and accelerating a polymerization reaction with a polymerizable compound, while the invention is not intended to be restricted thereby.

According to the invention, preferable examples of the radical polymerization initiator include (a) aromatic ketone, (b) onium salt compound, (c) organic peroxide, (d) thio compound, (e) hexaarylbiimidazole compound, (f) keto oxime ester compound, (g) borate compound, (h) azinium compound, (i) metallocene compound, (j) active ester compound, (k) compound having a carbon-halogen bond, (l) azo compound, and the like. Specific examples of the compounds of (a) to (l) will be shown in the followings, while the invention is not limited thereto.

(a) Aromatic Ketone

Examples of the (a) aromatic ketone which is preferable as the radical polymerization initiator usable in the invention include the compounds having a benzophenone skeleton and a thioxanthone skeleton as described in "RADIATION CURING IN POLYMER SCIENCE AND TECHNOLOGY", J. P. Fouassier and J. F. Rabek (1993), p. 77-117. For example, the following compounds may be mentioned.

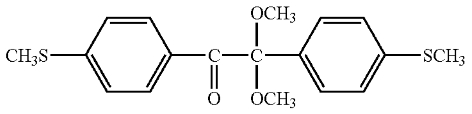

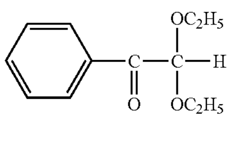

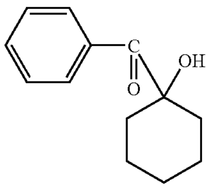

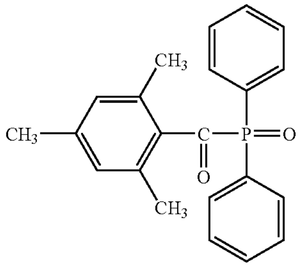

-continued

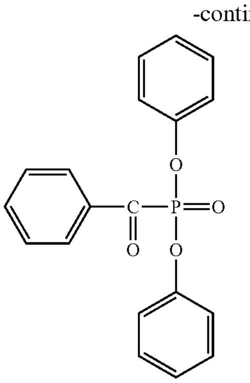

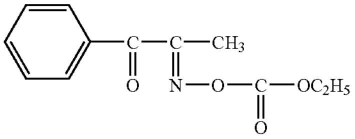

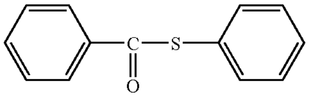

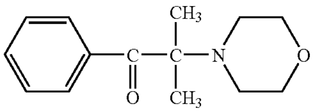

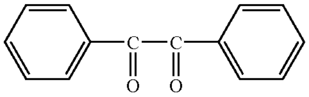

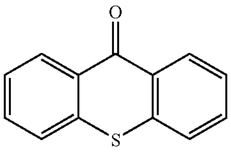

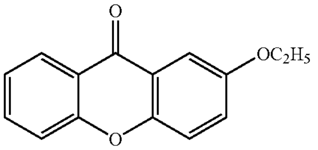

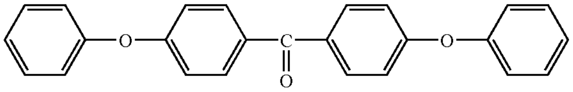

Among them, particularly preferable examples of the (a) aromatic ketone include the following compounds.

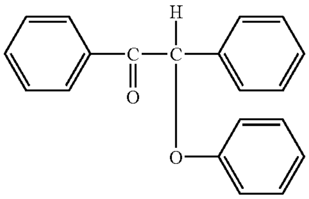

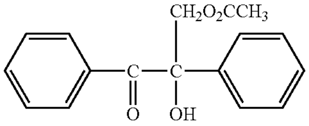

-continued

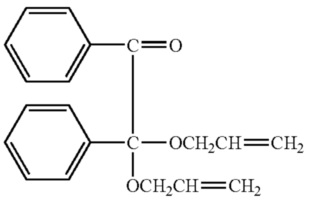

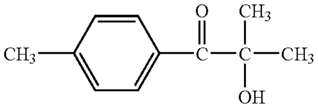

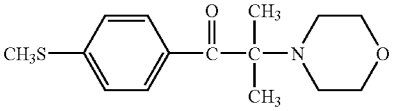

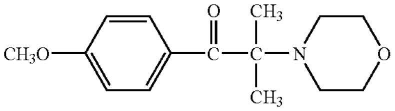

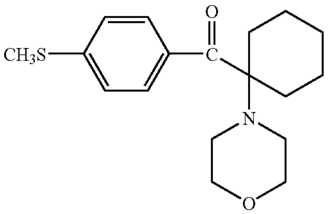

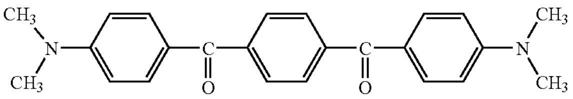

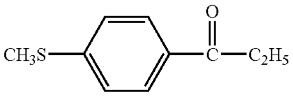

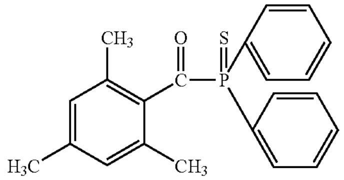

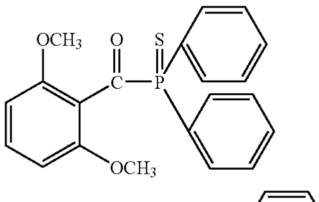

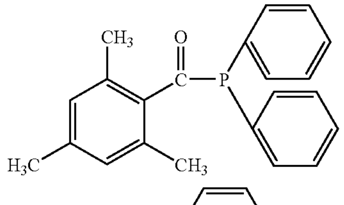

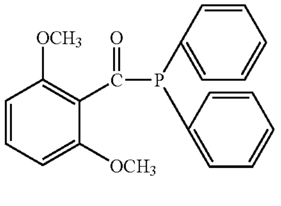

(b) Onium Salt Compound

Examples of the (b) onium salt compound which is preferable as the radical polymerization initiator usable in the invention include compounds represented by any one of the following Formulae (1) to (3).

$$Ar^1—I^+—Ar^2 \quad (Z^2)^- \tag{1}$$

$$Ar^3—N^+≡N \quad (Z^3)^- \tag{2}$$

(3)

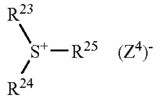

In Formula (1), $Ar^1$ and $Ar^2$ each independently represent an aryl group having up to 20 carbon atoms, which may be substituted; and $(Z^2)^-$ represents a counterion selected from the group consisting of a halogen ion, a perchlorate ion, a carboxylate ion, a tetrafluoroborate ion, a hexafluorophosphate ion and a sulfonate ion, and is preferably a perchlorate ion, a hexafluorophosphate ion or an arylsulfonate ion.

In Formula (2), $Ar^3$ represents an aryl group having up to 20 carbon atoms, which may be substituted; and $(Z^3)^-$ represents a counter ion which is defined in the same manner as $(Z^2)^-$.

In Formula (3), $R^{23}$, $R^{24}$ and $R^{25}$, which may be the same or different from each other, each represent a hydrocarbon group having up to 20 carbon atoms, which may be substituted; and $(Z^4)^-$ represents a counter ion which is defined in the same manner as $(Z^2)^-$.

Specific examples of the onium salt which may be suitably used in the invention include those described in paragraphs [0030] to [0033] of JP-A No. 2001-133969 or those described in paragraphs [0015] to [0046] of JP-ANo. 2001-343742, which have been previously suggested by the Applicant, and the specific aromatic sulfonium salt compounds described in JP-ANos. 2002-148790, 2001-343742, 2002-6482, 2002-116539 and 2004-102031.

(c) Organic Peroxide

Examples of the (c) organic peroxide which is preferable as the radical polymerization initiator usable in the invention include nearly all of organic compounds having one or more oxygen-oxygen bonds in the molecule. Specific examples thereof include methyl ethyl ketone peroxide, cyclohexanone peroxide, 3,3,5-trimethylcyclohexanon peroxide, methylcyclohexanone peroxide, acetylacetone peroxide, 1,1 -bis(tertiary-butylperoxy)-3,3,5-trimethylcyclohexane, 1,1-bis(tertiary-butylperoxy)cyclohexane, 2,2-bis(tertiary-butylperoxy)butane, tertiary-butyl hydroperoxide, cumene hydroperoxide, diisopropylbenzene hydroperoxide, paramethane hydroperoxide, 2,5-dimethylhexane-2,5-dihydroperoxide, 1,1,3,3 -tetramethylbutyl hydroperoxide, di-tertiary-butyl peroxide, tertiary-butylcumyl peroxide, dicumyl peroxide, bis(tertiary-butylperoxyisopropyl)benzene, 2,5-dimethyl-2,5-di(tertiary-butylperoxy)hexane, 2,5-xanoyl peroxide, succinic acid peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tertiary-butyl peroxyacetate, tertiary-butyl peroxypivalate, tertiary-butyl peroxyneodecanoate, tertiary-butyl peroxyoctanoate, tertiary-butyl peroxy-3,5,5-trimethylhexanoate, tertiary-butyl peroxylaurate, tertiary-carbonate, 3,3',4,4'-tetra(t-butlperoxycarbonyl)benzophenone, 3,3',4,4'- tetra(t-amylperoxycarbonyl)benzophenone, 3,3'4,4'-tetra(t-hexylperoxycarbonyl)benzophenone, 3,3',4,4'-tetra-(t-octylperoxycarbonyl)benzophenone, 3,3',4,4'-tetra-(cumylperoxycarbonyl)benzophenone, 3,3'4,4'-tetra-(p-isopropylcumylperoxycarbonyl)benzophenone, carbonyl di(t-butylperoxy dihydrogen diphthalate), carbonyl di(t-hexylperoxy dihydrogen diphthalate), and the like.

Among them, peroxyesters such as 3,3',4,4'-tetra(t-butylperoxycarbonyl)benzophenone, 3,3'4,4 '-tetra-(t-amylperoxycarbonyl)benzophenone, 3,3',4,4'-tetra-(t-hexylperoxycarbonyl)benzophenone, 3,3'4,4'-tetra-(t-octylperoxycarbonyl) benzophenone, 3,3',4,4'-tetra-(cumylperoxycarbonyl) benzophenone, 3,3'4,4'-tetra-(p-isopropylcumylperoxycarbonyl)benzophenone, and di-t-butyl diperoxyisophthalate are preferable.

(d) Thio Compound

Examples of the (d) thio compound which is preferable as the radical polymerization initiator usable in the invention include compounds having a structure represented by following Formula (4).

Formula (4)

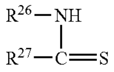

or

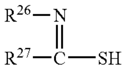

In Formula (4), $R^{26}$ represents an alkyl group, an aryl group or a substituted aryl group; $R^{27}$ represents a hydrogen atom or an alkyl group; and $R^{26}$ and $R^{27}$ may be bound to each other to represent a non-metallic atomic group necessary for forming a 5- to 7-membered ring which may contain a heteroatom selected from an oxygen atom, a sulfur atom and a nitrogen atom.

Specific examples of the thio compound represented by Formula (4) include the compounds shown below.

| No. | $R^{26}$ | $R^{27}$ |
|---|---|---|
| 1 | $—H$ | $—H$ |
| 2 | $—H$ | $—CH_3$ |
| 3 | $—CH_3$ | $—H$ |
| 4 | $—CH_3$ | $—CH_3$ |
| 5 | $—C_6H_5$ | $—C_2H_5$ |
| 6 | $—C_6H_5$ | $—C_4H_9$ |
| 7 | $—C_6H_4Cl$ | $—CH_3$ |
| 8 | $—C_6H_4Cl$ | $—C_4H_9$ |
| 9 | $—C_6H_4—CH_3$ | $—C_4H_9$ |
| 10 | $—C_6H_4—OCH_3$ | $—CH_3$ |
| 11 | $—C_6H_4—OCH_3$ | $—C_2H_5$ |
| 12 | $—C_6H_4—OC_2H_5$ | $—CH_3$ |
| 13 | $—C_6H_4—OC_2H_5$ | $—C_2H_5$ |
| 14 | $—C_6H_4—OCH_3$ | $—C_4H_9$ |
| 15 | $—(CH_2)_2—$ | |
| 16 | $—(CH_2)_2—S—$ | |
| 17 | $—CH(CH_3)—CH_2—S—$ | |
| 18 | $—CH_2—CH(CH_3)—S—$ | |
| 19 | $—C(CH_3)_2—CH_2—S—$ | |
| 20 | $—CH_2—C(CH_3)_2—S—$ | |
| 21 | $—(CH_2)_2—O—$ | |
| 22 | $—CH(CH_3)—CH_2—O—$ | |
| 23 | $—C(CH_3)_2—CH_2—O—$ | |
| 24 | $—CH{=}CH—N(CH_3)—$ | |
| 25 | $—(CH_2)_3—S—$ | |
| 26 | $—(CH_2)_2—CH(CH_3)—S—$ | |
| 27 | $—(CH_2)_3—O—$ | |
| 28 | $—(CH_2)_5—$ | |
| 29 | $—C_6H_4—O—$ | |
| 30 | $—N{=}C(SCH_3)—S—$ | |
| 31 | $—C_6H_4—NH—$ | |

-continued

| No. | $R^{26}$ | $R^{27}$ |
|---|---|---|
| 32 | 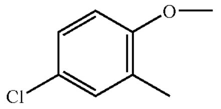 | |

(e) Hexaarylbiimidazole Compound

Examples of the (e) Hexaarylbiimidazole compound which is preferable as the radical polymerization initiator usable in the invention include the rofin dimers described in JP-B Nos. 45-37377 and 44-86516. Specific examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra (m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-triflourophenyl)-4,4',5,5'-tetraphenylbiimidazole, and the like.

(f) Keto Oxime Ester Compounds

Examples of the (f) keto oxime ester compound which is preferable as the radical polymerization initiator in the invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, 2-ethoxycarbonyloxyimino-1-phenylpropan-1-one, and the like.

(g) Borate Compounds

Examples of the (g) Borate compounds which is preferable as the radical polymerization initiator usable in the invention include compounds represented by following Formula (5).

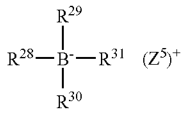

(5)

In Formula (5), $R^{28}$, $R^{29}$, $R^{30}$ and $R^{31}$, which may be the same or different from each other, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and two or more groups among $R^{28}$, $R^{29}$, $R^{30}$ and $R^{31}$ may be bound with each other to form a cyclic structure, with the proviso that at least one among $R^{28}$, $R^{29}$, $R^{30}$ and $R^{31}$ is a substituted or unsubstituted alkyl group; and $(Z^5)^+$ represents an alkali metal cation or a quaternary ammonium cation.

Specific examples of the compound represented by Formula (5) include the compounds described in U.S. Pat. Nos. 3,567,453 and 4,343,891, and European Patent Nos. 109,772 and 109,773, and the compounds shown below.

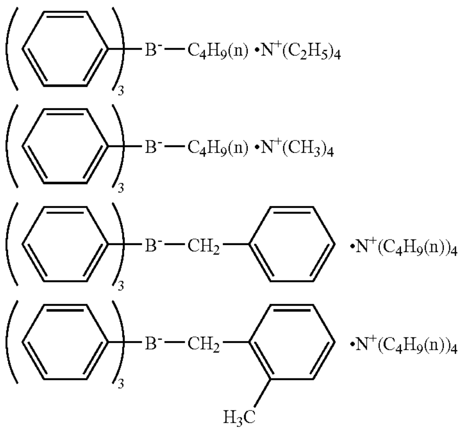

(h) Azinium Compounds

Examples of the (h) azinium salt compound which is preferable as the radical polymerization initiator usable in the invention include the compounds having an N—O bond as described in JP-A Nos. 63-138345, 63-142345, 63-142346 and 63-143537, and JP-B No. 46-42363.

(i) Metallocene Compounds

Examples of the (i) Metallocene compounds which is preferable as the radical polymerization initiator usable in the invention include the titanocene compounds described in JP-A Nos. 59-152396, 61-151197, 63-41484, 2-249 and 2-4705, and the iron arene complexes described in JP-A Nos. 1-304453 and 1-152109.

Specific examples of the titanocene compounds include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyrr-1-yl)phenyltitaniumbis(cyclopentadienyl)bis[2,6-difluoro-3-(methylsulfonamido)phenyl]titanium, bis(cyclopentadienyl)bis[2,6-difluoro-3-(N-butylbiaroylamino)phenyl]titanium, bis(cyclopentadienyl)bis[2,6-difluoro-3-(N-butyl-(4-chloropbenzoyl)amino)phenyl]titanium, bis(cyclopentadienyl)bis[2,6-difluoro-3-(N-benzyl-2,2-dimehylpentanoylamino)phenyl]titanium, bis(cyclopentadienyl)bis[2,6-difluoro-3-(N-(2-ethylhexyl-4-tolylsulfonyl)amino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyclopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, bis(cyclopentadienyl)bis[2,6-difluoro-3-(N-cyclohexylbenzoylamino)phenyl]titanium, and the like.

(j) Active Ester Compounds

Examples of the (j) active ester compound which is preferable as the radical polymerization initiator usable in the invention include the imidosulfonate compounds described in JP-A No. 62-6223, and the active sulfonates described in JP-B No. 63-14340 and JP-A No. 59-174831.

(k) Compounds Having Carbon-Halogen Bond

Examples of the (k) compound having a carbon-halogen bond which is preferable as the radical polymerization initiator usable in the invention include compounds represented by following formulae (6) to (12).

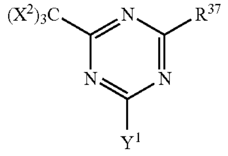

(6)

In Formula (6), $X^2$ represents a halogen atom; $Y^1$ represents —$C(X^2)_3$, —$NH_2$, —$NHR^{38}$, —$NR^{38}$, or —$OR^{38}$; $R^{38}$ represents an alkyl group, a substituted alkyl group, an aryl group or a substituted aryl group; and $R^{37}$ represents —$C(X^2)_3$, an alkyl group, a substituted alkyl group, an aryl group, a substituted aryl group, or a substituted alkenyl group.

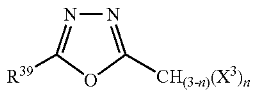

(7)

In Formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group, or a cyano group; $X^3$ represents a halogen atom; and n represents an integer from 1 to 3.

$$R^{40}—Z^6—CH_{(2-m)}(X^3)_mR^{41} \qquad (8)$$

In Formula (8), $R^{40}$ represents an aryl group or a substituted aryl group; $R^{41}$ represents any one of the groups shown below, or a halogen atom; $Z^6$ represents —C(=O)—, —C(=S)— or —$SO_2$—; $X^3$ represents a halogen atom; and m represents 1 or 2.

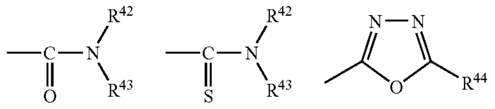

wherein $R^{42}$ and $R^{43}$ are each an alkyl group, a substituted alkyl group, an alkenyl group, a substituted alkenyl group, an aryl group or a substituted aryl group; and $R^{44}$ has the same meaning as defined for $R^{38}$ in Formula (6).

(9)

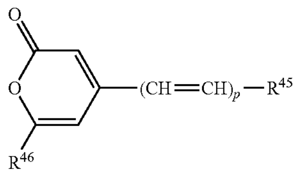

In Formula (9), $R^{45}$ represents an aryl group or a heterocyclic group, each of which may be substituted; $R^{46}$ represents a trihaloalkyl group or a trihaloalkenyl group, each having 1 to 3 carbon atoms; and p represents 1, 2 or 3.

(10)

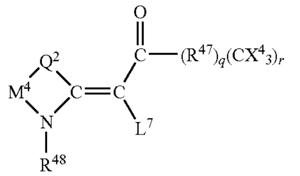

Formula (10) represents a carbonylmethylene heterocyclic compound having a trihalogenomethyl group. In Formula (10), $L^7$ represents a hydrogen atom or a substituent of formula: $CO—(R^{47})_q(C(X^4)_3)_r$; $Q^2$ represents a sulfur atom, a selenium atom, an oxygen atom, a dialkylmethylene group, an alken-1,2-ylene group, a 1,2-phenylene group, or an N—R group; $M^4$ represents a substituted or unsubstituted alkylene or alkenylene group, or represents a 1,2-arylene group; $R^{38}$ represents an alkyl group, an aralkyl group or an alkoxyalkyl group; $R^{47}$ represents a carbocyclic or heterocyclic divalent aromatic group; $X^4$ represents a chlorine atom, a bromine atom or an iodine atom; and either q=0 and r=1, or q=1 and r=1 or 2.

(11)

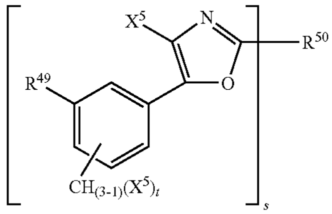

Formula (11) represents a 4-halogeno-5-(halogenomethylphenyl)oxazole compound. In Formula (11), $X^5$ represents a halogen atom; t represents an integer from 1 to 3; s represents an integer from 1 to 4; $R^{49}$ represents a hydrogen atom or a $CH_{3-t}X^5_t$ group; $R^{50}$ represents an unsaturated organic group which has a valency of s and may be substituted.

(12)

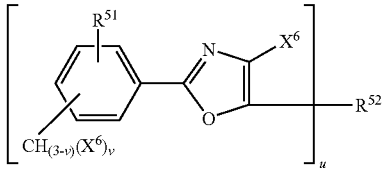

Formula (12) represents a 2-(halogenomethylphenyl)-4-halogeno-oxazole derivative. In Formula (12), $X^6$ represents a halogen atom; v represents an integer from 1 to 3; u represents an integer from 1 to 4; $R^{51}$ represents a hydrogen atom or a $CH_{3-v}X^6_v$ group; and $R^{52}$ represents an unsaturated organic group which has a valency of u and may be substituted.

Specific examples of the compounds having a carbon-halogen bond include the compounds described in Wakabayashi, et al., Bull. Chem. Soc. Japan, 42, 2924 (1969), for example, 2-phenyl-4,6-bis(trichlormethyl)-S-triazine, 2-(p-chlorphenyl)-4,6-bis(trichlormethyl)-S-triazine, 2-(p-tolyl)-4,6-bis(trichlormethyl)-3-triazine, 2-(p-methoxyphenyl)-4,6-bis(trichlormethyl)-S-triazine, 2-(2',4'-dichlorphenyl)-4,6-bis(trichlormethyl)-S-triazine, 2,4,6-tris(trichlormethyl)-S-triazine, 2-methyl-4,6-bis(trichlormethyl)-S-triazine, 2-n-nonyl-4,6-bis(trichlormethyl)-S-triazine, 2-(α,α,β-trichlorethyl)-4,6-bis(trichlormethyl)-S-triazine, and the like. In addition, the compounds described in U.K. Patent No. 1388492, for example, 2-styryl-4,6-bis(trichlormethyl)-S-triazine, 2-(p-methylstyryl)-4,6-bis(trichlormethyl)-S-triazine, 2-(p-methoxystyryl)-4,6-bis(trichlormethyl)-S-triazine, 2-(p-methoxystyryl)-4-amino-6-trichlormethyl-S-triazine, and the like; the compounds described in JP-A No. 53-133428, for example, 2-(4-methoxy-naphth-1-yl)-4,6-bis-trichlormethyl-S-triazine, 2-(4-ethoxy-naphth-1-yl)-4,6-bis-trichlormethyl-S-triazine, 2-[4-(2-ethoxyethyl)-naphth-1-yl]-4,6-bis-trichlormethyl-S-triazine, 2-(4,7-dimethoxy-naphth-1-yl)-4,6-bis-trichlormethyl-S-triazine, 2-(acenaphth-5-yl)-4,6-bis-trichlormethyl-S-triazine, and the like; the compounds described in German Patent No. 3337024, for example, the compounds shown below; and the like may also be mentioned. Furthermore, there may be mentioned a family of compounds as shown below, which can be easily synthesized by a person having ordinary skill in the art according to the synthesis method described in M. P. Hutt, E. F. Elslager and L. M. Herbel, "Journal of Heterocyclic Chemistry", Vol. 7, No. 3, p. 511-(1970), for example, the following compounds.

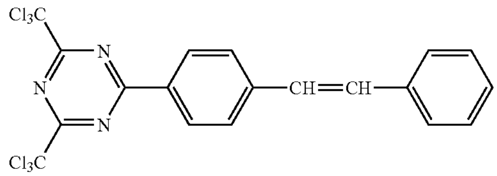

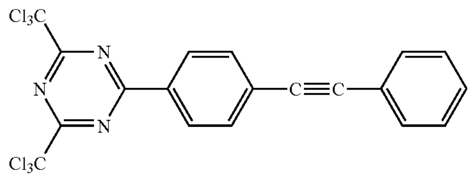

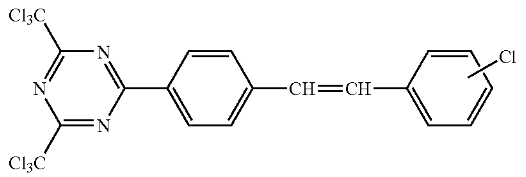

-continued

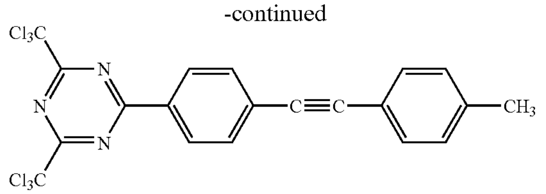

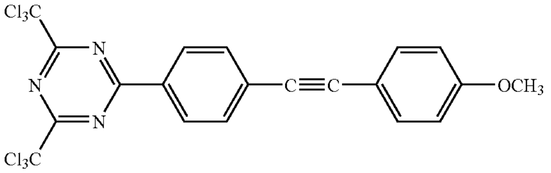

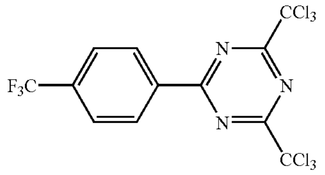

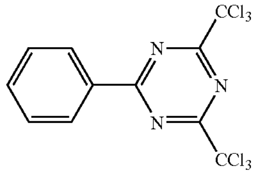

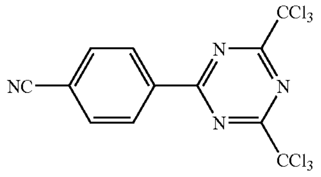

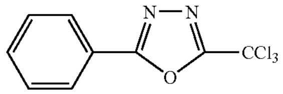

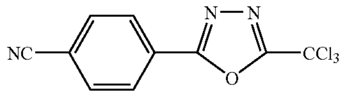

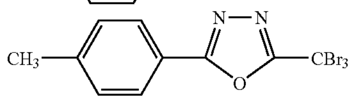

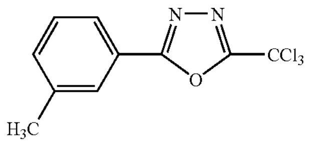

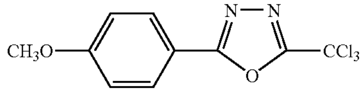

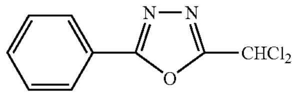

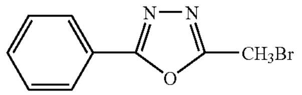

(l) Azo Compound

Examples of the (l) azo compound which is preferable as the radical polymerization initiator usable in the invention include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methylpropionamideoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide], 2,2'-azobis(2,4,4-trimethylpentane), and the like.

More preferable examples of the radical polymerization initiatorforthe invention include the (a) aromatic ketone, (b) onium salt compound, (c) organic peroxide, (e) hexaarylbiimidazole compound, (i) metallocene compound, and (k) compound having a carbon-halogen bond, and most preferable examples thereof include an aromatic iodonium salt, an aromatic sulfonium salt, a titanocene compound, and a trihalomethyl-S-triazine compound represented by Formula (6).

The polymerization initiators may be added in a proportion of preferably 0.01% by mass to 10% by mass, and more preferably 0.1% by mass to 3% by mass, based on the total solid content of the resin composition for laser engraving containing the polymerizable compound.

The effect of the addition of the polymerizable compound, which is a sufficient crosslinking density of the relief forming layer and the printing durability of the relief layer, can be sufficiently exhibited when the content of the polymerizable compound is set at 0.01% by mass or more with respect to the total solid content of the resin composition for laser engraving.

The polymerization initiators are suitably used by using them individually alone, or in combination of two or more species.

Plasticizer

Examples of the plasticizer include dioctyl phthalate, didodecyl phthalate, triethylene glycol dicaprylate, methyl glycol phthalate, tricresyl phosphate, dioctyl adipate, dibutyl sebacate, triacetylglycerin, and the like. Examples of the plasticizer further include polyethylene glycols, polypropylene glycol(mono-ol type, diol type and the like), and polypropylene glycol(mono-ol type, diol type and the like).

Since the plasticizer is expected to have an effect to soften the relief forming layer, the plasticizer is desired to have good compatibility with the binder polymer. In general, a highly hydrophilic compound has good compatibility with the binder polymer. Among highly hydrophilic compounds, an ether compound containing a heteroatom in a straight chain, or a compound having a structure in which a hydrophilic group such as secondary amine and a hydrophobic group are alternately repeated, can be preferably used. The presence of the hydrophilic group such as —O— or —NH— achieves the compatibility of such compounds with PVA compounds, and the other hydrophobic group weakens the intermolecular force of PVA compounds, to thereby contribute to the softening.

A compound having fewer hydroxyl groups which are capable of forming hydrogen bonding between PVA compounds can be also preferably used as the plasticizer. Examples of such compound include ethylene glycol, propylene glycol, and dimers, trimers, and homo-oligomers or co-oligomers such as tetramer or higher-mers of ethylene glycol and propylene glycol, and secondary amines such as diethanolamine and dimethylolamine. Among these, ethylene glycols(monomers, dimers, trimers and oligomers) having small steric hindrance, excellent compatibility and low toxicity, are particularly preferably used as the plasticizer.

Ethylene glycols are roughly classified into three types according to the molecular weight. The first group includes ethylene glycol, which is a monomer; the second group includes diethylene glycol, which is a dimer, and triethylene glycol, which is a trimer; and the third group includes polyethylene glycol, which is a tetramer or higher one. Polyethylene glycol is roughly classified into liquid polyethylene glycol having a molecular weight in the range of 200 to 700, and solid polyethylene glycol having a molecular weight of 1000 or greater, and those are commercially available under names followed by the average molecular weight in many cases.

As a result of intensive search, the present inventors have found that the lower molecular weight of the plasticizer is, the effect of the plasticizer to soften a resin is enhanced. In consideration of this, compounds which may be particularly preferably used as the plasticizer are ethylene glycol which belongs to the first group, diethylene glycol and triethylene glycol which belong to the second group, and tetraethylene glycol(tetramer) which belongs to the third group. Among them, diethylene glycol, triethylene glycol and tetraethylene glycol can be more preferably used as the plasticizer from the viewpoints of low toxicity, absence of extraction from the resin composition, and excellent handling property thereof. Mixtures of two or more of the plasticizers can be also preferably used.

The plasticizer may be added in a proportion of 10% by mass or less with respect to the total mass of the solid content of the resin composition for laser engraving.

Additive for Enhancing Heat Transfer

The engraving sensitivity of the relief forming layer can be further improved by employing a highly thermally conductive substance as an additive for enhancing heat transfer in order to assist heat transfer in the relief forming layer. Examples of the additive for enhancing heat transfer include an inorganic compound such as a metal particle and an organic compound such as an electrically conductive polymer.

Preferable examples of the metal particle include gold microparticles, silver microparticles and copper microparticles, each having a particle size in the order of micrometers to a few nanometers. Preferable examples of the organic compound include polymers which are generally known as electrically conductive polymers.

Preferable examples of the electrically conductive polymers include polythiophene, polyisothianaphthene, polypyrrole, polyethylene dioxythiophene, polyacetylene and modified compounds thereof From the viewpoint of being highly sensitive, polythiophene, polyethylene dioxythiophene and modified compounds thereof are further preferable.

In embodiments, the combination of a bio-degradable plastic such as a polylactide (for example, LANDY PL-1000 and LANDY PL-2000 (both trade names, manufactured by Miyoshi Oil & Fat Co., Ltd.)) and a hydrophilic polymer such as PVA can be preferably used in the invention as described above. When such a combination is employed, the electrically conductive polymer can be preferably employed in the form of an aqueous dispersion or an aqueous solution, since the compatibility of the bio-degradable plastic and the hydrophilic polymer such as PVA can be improved, whereby the relief forming layer can obtain high film strength and improved engraving sensitivity due to the improvement in the heat transfer efficiency.

Specific examples of the metal particle and the electrically conductive polymer include commercially available products supplied by Sigma Aldrich Corp., Wako Pure Chemical Industries, Ltd., Tokyo Chemical Industry Co., Ltd., and the like.

Additives for Enhancing Engraving Sensitivity

In addition to the additive for enhancing heat transfer, heat-generating compounds such as nitrocellulose can be further employed as an additive for enhancing the engraving sensitivity.

Nitrocellulose, that is a self-reactive compound, generates heat at the time of laser engraving to assist thermal decomposition of the co-existing hydrophilic polymer. It is assumed that the engraving sensitivity is enhanced as a result thereof.

Any nitrocellulose can be used as long as it is capable of thermal decomposition, and any of RS (regular soluble) nitrocellulose, SS (spirit soluble) nitrocellulose and AS (alcohol soluble) nitrocellulose can be used in the invention. The nitrogen content of the nitrocellulose is usually about 10% by mass to 14% by mass, preferably 11% by mass to 12.5% by mass, and more preferably about 11.5% by mass to 12.2% by mass. The degree of polymerization of the nitrocellulose may also be selected from a wide range of about 10 to 1500. The polymerization degree of the nitrocellulose is typically 10 to 900, and preferably about 15 to 150. Preferable examples of the nitrocellulose include those having a solution viscosity of 20 seconds to 1/10 seconds, more preferably about 10 seconds to 1/8 seconds, measured according to the method of viscosity indication provided by Hercules Powder Company, that is also known as JIS K6703 "Nitrocelluloses for Industrial Use". The nitrocellulose which can be used in the invention typically has a solution viscosity of 5 seconds to 1/8 seconds, which is preferably about 1 second to 1/8 seconds.

The RS nitrocellulose (for example, a nitrocellulose having a nitrogen content of about 11.7% to 12.2%), which is soluble in a ester such as ethyl acetate, a ketone such as methyl ethyl ketone or methyl isobutyl ketone, or an ether such as cellosolve, can be used as a nitrocellulose which can be contained in the resin composition for laser engraving in many cases. The nitrocellulose may be used singly or in combination of two or more thereof as necessary.

The content of nitrocellulose may be selected as long as decrease in the engraving sensitivity of the resin composition for laser engraving can be avoided, and the content is typically 5 parts by mass to 300 parts by mass, preferably 20 parts by mass to 250 parts by mass, more preferably 50 parts by mass to 200 parts by mass, and particularly preferably 40 parts by mass to 200 parts by mass, relative to 100 parts by mass of the binder polymer and the polymerizable compound.

Co-sensitizer

The sensitivity required for photo-curing of the resin composition for laser engraving may be further enhanced by using a co-sensitizer. While the operating mechanism is not clear, it is thought to be largely based on the following chemical process. Namely, it is presumed that various intermediate active species (radicals and cations) generated in the course of a photoreaction initiated by a polymerization initiator and an addition polymerization reaction subsequent thereto, react with the co-sensitizer to generate new active radicals. These intermediate active species may be roughly classified into (a) compounds which are reduced and can generate active radicals; (b) compounds which are oxidized and can generate active radicals; and (c) compounds which react with less active radicals, and are converted to more active radicals or act as a chain transfer agent. However, in many cases, there is no general theory applicable on which individual compound belongs to which class. Examples of the co-sensitizer which may be applied in the invention include the following compounds.

(a) Compounds which Generate Active Radicals Upon being Reduced

Compounds having a carbon-halogen bond are classified in this group. It is presumed that an active radical is generated when the carbon-halogen bond is reductively cleaved. Specific preferable examples of the compound include trihalomethyl-s-triazines and trihalomethyloxadiazoles.

Compounds having a nitrogen-nitrogen bond are also classified in this group. It is presumed that an active radical is generated when the nitrogen-nitrogen bond is reductively cleaved. Specific preferable examples of the compound include hexaarylbiimidazoles.

Compounds having an oxygen-oxygen bond are also classified in this group. It is presumed that an active radical is generated when the oxygen-oxygen bond is reductively cleaved. Specific preferable examples of the compound include organic peroxides.

Onium compounds are also classified in this group. It is presumed that an active radical is generated when a carbon-heteroatom bond or an oxygen-nitrogen bond in an onium compound is reductively cleaved. Specific preferable examples of the compound include diaryliodonium salts, triarylsulfonium salts, N-alkoxypyridinium salts (azinium) salts, and the like.

Ferrocenes and iron arene complexes are also classified in this group. It is presumed that an active radical is reductively generated therefrom.

(b) Compounds Which Generate Active Radicals Upon Being Oxidized

Alkylate complexes can be classified in this group. It is presumed that an active radical is generated when a carbon-heteroatom bond therein is oxidatively cleaved. Specific preferable examples thereof include triarylalkylborates.

Alkylamine compounds can be also classified in this group. It is presumed that an active radical is generated when a C—X bond on a carbon atom which is adjacent to a nitrogen atom therein is cleaved through oxidation. Preferable examples of the X include a hydrogen atom, a carboxyl group, a trimethylsilyl group, a benzyl group and the like. Specific preferable examples of the alkylamine compoud include ethanolamines, N-phenylglycine, and N-trimethylsilylmethylanilines.

Sulfur-containing ortin-containing compounds, which are obtained by substituting the nitrogen atom of the above-mentioned alkylamine compounds by a sulfur atom or a tin atom, can be also classified in this group and may generate an active radical in a similar manner as the alkylamine compounds. Compounds having an S—S bond are also known to have sensitivity enhancing property by the S—S bond cleavage.

α-substituted methylcarbonyl compounds, which may generate an active radical by the cleavage of a bond between a carbonyl moiety and an a-carbon atom through oxidation, can be also classified in this group. Compounds obtained by converting the carbonyl moiety in the α-substituted methylcarbonyl compounds into an oxime ether also show an effect which is similar to that of the α-substituted methylcarbonyl compounds. Specific examples of the compounds include 2-alkyl-1-[4-(alkylthio)phenyl]-2-morpholinopronone-1's, and oxime ethers obtained by reacting a 2-alkyl-1-[4-(alkylthio)phenyl]-2-morpholinopronone-1 with a hydroxylamine and then etherifying the N—OH moiety in the resultant.

Sulfinic acid salts can be also classified in this group. An active radical may be reductively generated therefrom. Specific examples thereof include sodium arylsulfinate.

(c) Compounds Which Convert Less Active Radicals to More Active Radicals by Reacting Therewith, and Compounds Which Act as a Chain Transfer Agent Compounds having SH, PH, SiH or GeH within the molecule can be classified in this group. These compounds may generate a radical by donating hydrogen to a less active radical species, or may generate a radical by being oxidized and then deprotonated. Specific examples thereof include 2-mercaptobenzothiazoles, 2-mercaptobenzoxazoles, 2-mercaptobenzimidazoles, and the like.

More specific examples of these co-sensitizers are described in, for example, JP-A No. 9-236913, as additives for enhancing the sensitivity, and those may also be applied in the invention. Some examples thereof will be shown below, while the invention is not limited thereto. In the following formulae, "-TMS" represents a trimethylsilyl group.

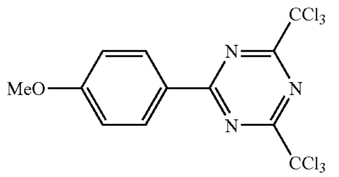

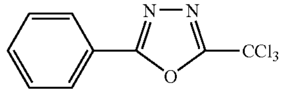

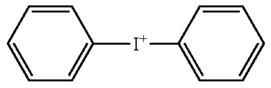

$OTY^-$

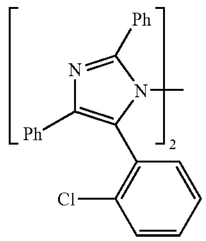

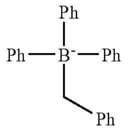

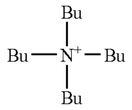

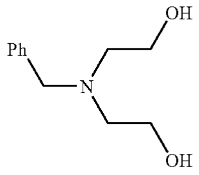

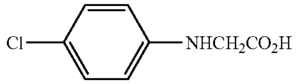

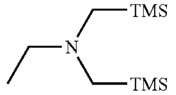

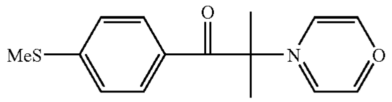

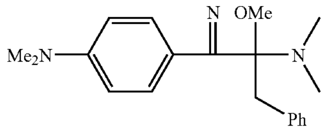

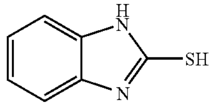

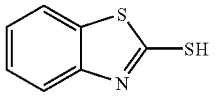

As is similar to the photo-thermal conversion agent, various chemical modifications for improving the properties of the resin composition for laser engraving may be carried out to the co-sensitizer. Examples of a method for the chemical modification include: bonding with a photo-thermal conversion agent, a polymerizable compound, or with some other part; introduction of a hydrophilic site; enhancement of compatibility; introduction of a substituent for suppressing crystal precipitation; introduction of a substituent for enhancing adhesiveness; and conversion into a polymer.

The co-sensitizer may be used singly, or in combination oftwo or more species thereof The content of the co-sensitizer in the resin composition for laser engraving is preferably 0.05 parts by mass to 100 parts by mass, more preferably 1 parts by mass to 80 parts by mass, and even more preferably 3 parts by mass to 50 parts by mass, relative to 100 parts by mass of the polymerizable compound.

(I) Polymerization Inhibitor

A small amount of thermal polymerization inhibitor can be preferably employed in the invention in view of inhibiting unnecessary thermal polymerization of the polymerizable compound during the production or storage of the resin composition. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerium (I) salt, and the like.

Q-1301 (trade name, manufactured by Wako Pure Chemical Industries, Ltd., a 10% tricresyl phosphate solution) can be preferably used as the polymerization inhibitor from the viewpoint of excellent stability in storage of the relief printing plate precursor for laser engraving having the relief forming layer containing the resin composition for laser engraving of the invention. When Q-1301 is used in combination with the polymerizable compound, the storage stability of the relief printing plate precursor for laser engraving can be significantly excellent, and good laser engraving sensitivity may be obtained. The addition amount of the thermal polymerization inhibitor is preferably 0.01% by mass to 5% by mass with respect to the total mass of the resin composition for laser engraving. Also, if necessary, in order to prevent the inhibition of polymerization caused by oxygen, a higher fatty acid compound such as behenic acid or behenic acid amide may be added to the resin composition and can be localized at the surface of the relief forming layer during the course of drying of the relief forming layer performed after the resin composition is applied on a support or the like. The addition amount of the higher fatty acid compound can be preferably 0.5% by mass to 10% by mass with respect to the total mass of the resin composition.

Colorant

A colorant such as a dye or a pigment may also be added to the resin composition for laser engraving for the purpose of coloring the resin composition. The addition of the dye or the pigment may enhance properties of the resin composition such as the visibility of the image part, suitability for image density measuring device and the like. A pigment is particularly preferably used as the colorant in the invention. Specific examples of the colorant include pigments such as phthalocyanine pigments, azo pigments, carbon black or titanium oxide; and dyes such as Ethyl Violet, Crystal Violet, azo dyes, anthraquinone dyes or cyanine dyes. The amount of addition of the colorant is preferably about 0.5% by mass to 5% by mass with respect to the total mass of the resin composition.

Other Additives

In order to improve the properties of a cured film formed of the resin composition for laser engraving, known additives such as a filler may also be added.

Examples of the filler include carbon black, carbon nanotubes, fullerene, graphite, silica, alumina, aluminum, calcium carbonate and the like, and these fillers can be used individually or as mixtures of two or more thereof.

Relief Printing Plate Precursor for Laser Engraving

The relief printing plate precursor for laser engraving of the invention has a relief forming layer which contains the components described above and is provided on a support. The relief forming layer can be obtained as a curable one by employing a binder polymer having an unsaturated bond and/or a polymerizable compound which is an arbitrary component in combination.

The relief printing plate precursor for laser engraving may further have an arbitrary other layer, and examples of such an arbitrary other layer include an adhesive layer which resides between the support and the relief forming layer so as to enhance the adhesiveness which works therebetween, and a slip coat layer and/or a protective layer which can be provided on the relief forming layer to protect and/or modify the surface property of the relief forming layer.

Preparation of Relief Forming Layer

The relief printing plate precursor for laser engraving of the invention can be prepared by providing the relief forming layer over (on or above) a support. The relief forming layer can be provided over the support by coating or transferring. When the relief forming layer is formed as a curable relief forming layer, the relief printing plate precursor can be subjected to crosslinking to cure the relief forming layer after the application of the relief forming layer.

The thus-obtained relief forming layer can be engraved with laser to prepare a relief printing plate.

The curable relief forming layer is advantageous to suppress wearing of the relief layer of the relief printing plate and/or to make the relief layer with a sharp (well-defined) shape since the hardness thereof can be increased by the crosslinking and curing.

The relief forming layer may be obtained by molding the resin composition for forming the relief forming layer into a sheet shape or a sleeve shape over the surface of the support.

The application solution composition for forming a relief forming layer may be prepared, for example, by dissolving or dispersing a photo-thermal conversion agent and an optional polymerization initiator and/or an optional polymerizable compound used if desired to a solution which is formed by dissolving, in a solvent suitable for a binder polymer, the binder polymer and an optional plasticizer and/or the like used if desired. The resulting application solution composition for forming a relief forming layer can be applied onto a support or on the surface of the adhesive layer formed on a support and dried to remove the solvent, whereupon a relief forming layer can be prepared. It is necessary that most of the solvent component used for preparing the application solution is removed during the drying. Therefore, it is preferable that a lower alcohol which has a low-boiling solvent such as ethanol is used and that the addition amount of the solvent is small. More specifically, it is preferable to make the solid concentration of the application solution be 40% by mass or more. The viscosity of the application solution is not necessary required to be low so as to result in fluidity which is near liquid. The viscosity may be a bit high as long as a uniform layer can be formed by application of the application solution.

It is possible to enhance the fluidity of the application solution and to suppress the amount of the solvent added to the application solution by warming the application solution. However, when the temperature resulted by the warming is too high, undesired polymerization or undesired crosslinking reaction of an unsaturated bond, an optional polymerizable compound and/or the like may occur. Therefore, particularly when the application solution composition for forming a relief forming layer has a formulation including a polymerizable compound or a polymerization initiator, it is preferable to adjust the temperature for preparation of the composition to be within a range of 30° C. to 80° C.

Examples of the method for preparing a relief forming layer include: a method including removing the solvent from the application solution composition for forming a relief forming layer prepared as described above and fusion extruding the composition onto a support; and a method including flowing the application solution composition for forming a relief forming layer on a support and drying the resultant in an oven to remove the solvent from the composition.

A protective film may be laminated on the surface of the thus-formed relief forming layer as will be described in detail as hereinafter. In relation thereto, examples of the method for the preparation of the relief forming layer further include a method which includes firstly laminating a relief forming layer on a protective film by the same method as mentioned above, and then laminating a support and the relief forming layer.

In order to control the thickness of the relief forming layer for preparing a relief forming layer having a large thickness, the applying, drying or laminating of the application solution composition can be performed for plural times.

In the drying of a relief forming layer, it is preferable to remove the solvent used for the preparation of the application solution composition as much as possible. In consideration thereof, the drying is preferably conducted in an atmosphere where temperature is 40° C. to 150° C. under the condition of about 10 minutes to about 500 minutes.

Application of energy, which can be optionally performed if desired, to the dried and hardened relief forming layer by means selected from heating at about 40° C. to 150° C., irradiation of ultraviolet ray and the like may enable to react polymerizing groups in the composition, which are contained in at least the polymerizable compound, so that a crosslinking structure is formed in the relief forming layer.

In both of the cases where the crosslinking structure is formed and where the crosslinking structure is not particularly formed, it is preferable that the relief forming layer has a thickness of 0.05 mm or more for providing a sufficient unevenness to a relief layer formed by engraving the relief forming layer.

In view of satisfying various properties to be suitable to printing such as resistance to abrasion or ink transfer property, thickness of the relief forming layer is preferably 0.05 mm to 10 mm, more preferably 0.05 mm to 7 mm and, particularly preferably, 0.05 mm to 0.3 mm.

Support

The support which can be used in the relief printing plate precursor for laser engraving typically has a flat plate shape or a sheet shape.

The material used in the support is not particularly limited, while a material having high dimensional stability is preferably used. Examples thereof include metals such as steel, stainless steel or aluminum; thermo-plastic resins such as polyesters (for example, PET, PBT and PAN) or polyvinyl chloride; thermo-setting resins such as epoxy resin or phenolic resin; synthetic rubbers such as styrene-butadiene rubber; and fiber reinforced plastic (FRP) resins formed of resin materials such as epoxy resin or phenolic resin containing reinforcing fibers such as a glass fiber, a carbon fiber or the like. Among these, a polyethylene terephthalate (PET) film and a steel substrate is preferable in view of strength, durability and availability.

The shape of the support depends on whether the relief forming layer is a sheet-shaped or a sleeve-shaped.

The reliefprinting plate precursor of the invention can be obtained by providing the relief forming layer on the support.

The relief printing plate precursor of the invention may further have, on the support, one or more layers which are other than the relief forming layer if desired. Details of such other layers are discredited below.

Adhesive Layer:

The relief printing plate precursor according to the invention may have an adhesive layer disposed between the relief forming layer and the support in view of reinforcing the adhesive force working between these layers.

A compound having affinity to the compound contained in the relief forming layer as well as to the support may be selected and used as to a material used for the adhesive layer. The adhesive layer may enhance the adhesive force working between the support and the adhesive layer and/or between the adhesive layer and the relief forming layer. In view of the above, the structure of the adhesive layer is not limited to a single-layer structure. For example, the adhesive layer may have a multiple layer structure having a layer containing a compound being excellent in adhesiveness to the support and a layer containing a compound being excellent in adhesiveness to the relief forming layer.

The adhesive force between the support and the adhesive layer is preferably as follows. Namely, when a combination of the adhesive layer and the relief forming layer are peeled off, at a rate of 400 mm/min, from the support provided in a laminate having the support, the adhesive layer and the relief forming layer provide in this order, the peeling force per a unit width of 1 cm of the sample is preferably 1.0 N/cm or larger, more preferably 3.0 N/cm or larger, and most preferably the combination is unpeelable from the support under this condition.

The adhesive force between the adhesive layer and the relief forming layer is preferably as follows. Namely, when the adhesive layer is peeled off, at a rate of 400 mm/min, from the relief forming layer provided in a laminate of the adhesive layer and the relief forming layer, the peeling force per a unit width of 1 cm of the sample is preferably 1.0 N/cm or larger, more preferably 3.0 N/cm or larger, and most preferably the adhesive layer is unpeelable from the relief forming layer under this condition.

Examples of the material which configures the adhesive layer include generally used commercially available adhesives such as an industrial adhesive (e.g., trade name: EC-1368, manufactured by Sumitomo 3M; and trade name: EM123-1N, manufactured by Cemedine), a resin having a functional group exhibiting affinity to a resin which forms the support, a polyfunctional monomer having an unsaturated bond, a resin having the similar or same functional group with that of a binder polymer contained in the relief forming layer, and materials mentioned in Handbook of Adhesives, Second Edition (1977) edited by I. Skies.

In view of handling property of the relief printing plate (such as easiness in attaching to devices), thickness of the adhesive layer is preferably in a range of about 0.01 μm to about 500 μm, and more preferably in a range of 0.05 μm to 300 μm.

When an adhesive layer is disposed in the precursor of the invention, the adhesive layer is typically provided by a method including applying a composition for the adhesive layer on a surface of the support followed by drying.

Protective Film and Slip Coat Layer

The relief forming layer becomes the part at which a relief is formed after the laser engraving. The surface of the convex portion of the relief functions as an ink deposition portion. There is almost no concern for generation of damages or depressions on the surface of the relief forming layer which might affect printing when the relief forming layer is cured by crosslinking, since the thus-cured relief forming layer has strength and hardness. However, the crosslink-curable relief forming layer which is not subjected to the crosslinking and the relief forming layer which is not crosslink-curable tend to have soft surfaces and are concerned for generation of damages or depressions on the surface thereof when they are handled. From the viewpoint of prevention of the damages or depressions, a protective film may be provided over (on or above) the relief forming layer.

If the protective film is too thin, the effect of preventing damages and depressions may not be obtained, and if the protective film is too thick, inconvenience may arise upon the handling thereof and production costs therefor may become higher. In consideration of these, the thickness of the protective film is preferably 25 μm to 500 μm, and more preferably 50 μm to 200 μm.

Films formed of known materials as that for a protective film of a printing plate, for example can be used in the invention, and examples thereof include polyester films such as those of PET (polyethylene terephthalate), and polyolefin films such as those of PE (polyethylene) or PP (polypropylene). The surface of the film may be plain (smooth), or may also be matt to have very minute irregularities.

The protective film is required to be capable of being easily removed from the surface of the relief forming layer if desired as well as be capable of stably adhered to the surface of the relief forming layer, since the protective film is peeled off from the surface of the relief forming layer when the laser engraving is performed. In view of improving this removing property, a slip coat layer can be provided on a surface of the protective film to which the relief forming layer contacts.

The material for forming the slip coat layer preferably contains, as the main component, a water-soluble or water-dispersible and less tacky resin such as polyvinyl alcohol, polyvinyl acetate, a partially saponified polyvinyl alcohol, a hydroxyalkylcellulose, an alkylcellulose or a polyamide resin. Among these, a partially saponified polyvinyl alcohol having a degree of saponification of 60% by mole to 99% by mole, a hydroxyalkylcellulose with an alkyl group having 1 to 5 carbon atoms and an alkylcellulose with an alkyl group having 1 to 5 carbon atoms can be particularly preferably used from the viewpoint of lesser tackiness.

In the case where the protective film is peeled off, at a rate of 200 mm/min, from a laminate of the relief forming layer (and the slip coat layer) and the protective film, the peeling force per a unit width of 1 cm of the sample is preferably 5 mN/cm to 200 mN/cm, and more preferably 10 mN/cm to 150 mN/cm. When the peeling force is 5 mN/cm or more, the relief printing plate precursor can be subjected to operation without the removal of the protective film in the middle of the operation, and when the peel force is 200 mN/cm or less, the protective film may be removed comfortably.

When a protective film is provided on a relief forming layer, the protective film and the relief forming layer are typically layered followed by laminating. Examples of a method for the lamination includes: a method in which a body in which the protective film and the relief forming are layered is passed through a space, which resides between a pair of calendar rolls, at least one of which can be heated, and which is heated at 40° C. to 150° C. during the passage, so that the protective film and the relief forming layer can be press-contacted with heat to be laminated (attached with each other); and a method in which a surface of the relief forming layer, in which a small amount of solvent (such as ethanol or water) is impregnated, is prepared and the relief forming layer is tightly attached to the protective film via the surface so that the protective film and the relief forming layer can be laminated.

Formation of Relief Forming Layer

Any known methods for molding a resin may be employed when the relief forming layer is formed in a sleeve shape. Examples thereof include: a casting method; a method including extruding a resin from a nozzle or a dice by a machine such as a pump or an extruder and adjusting a thickness of the resultant by use of a blade or by a calendar processing with rolls. During the molding, heat with a temperature, by which characteristics of a resin composition which configures the relief forming layer are not deteriorated, can be applied to the molding system. A rolling treatment, an abrading treatment, and/or the like may be further performed if necessary.

When the relief forming layer is made into a sleeve form, the relief forming layer may be formed by being molded into a cylindrical shape at the initial stage of the molding, or may be formed by being molded into a sheet shape at first and then made into a cylindrical shape by being fixed on a cylindrical support. There is no particular limitation for the fixing of the sheet shaped-support to the cylindrical support, and examples thereof include: fixing the sheet shaped-support to the cylindrical support by using an adhesive tape having an adhesive layer, a tackifying layer, or the like provided on each of both sides; and fixing the sheet shaped-support to the cylindrical support via a layer containing an adhesive agent.

Examples of the adhesive tape include: a tape having a tackifying agent layer or an adhesive agent layer formed of an acrylic resin, a methacrylic resin, a styrene thermoplastic elastomer or the like formed on both sides of a film base material such as a polyester film or a polyolefin film; and a tape which has a base material formed of a foamed body of a polyolefin resin such as polyethylene or a polyurethane resin and provided with a tackifying agent layer or an adhesive agent layer as described above on both of sides thereof and has a cushioning property. A commercially available tape with adhesive on both sides or a cushion tape having tackifying agent layers on both sides may be appropriately used as well.

The adhesive agent layer used in the case that a cylindrical support and the relief forming layer are fixed via the adhesive agent layer can be formed using any known adhesive agents. Examples of an adhesive agent which can be used for the fixing of the relief forming layer to the cylindrical support include a rubber adhesive agent such as a styrene butadiene rubber (SBR), a chloroprene rubber or a nitrile rubber, and an adhesive agent which is hardened by moisture in air such as a silicone resin or a polyurethane resin having silyl group.

When the relief forming layer is made into a cylindrical shape, the relief forming layer may be formed by being molded into a cylindrical shape by a known method at first and then fixed on a cylindrical support, or may be formed by directly molded into a cylindrical shape by extrusion molding or the like so as to be a sleeve shape. The former method is preferably used in view of the productivity. When the relief forming layer is made into a sleeve shape, the thus-formed sleeve-shaped relief forming layer may still be subjected to crosslinking and hardened after being fixed onto a cylindrical support if necessary, and a rolling treatment, an abrading treatment or the like can be further carried out if desired.

Examples of the cylindrical support used in making the relief forming layer into a sleeve shape include: a metal sleeve formed of a metal such as nickel, stainless steel, iron or aluminum; a plastic sleeve formed by molding a resin; a sleeve formed of a fiber reinforced plastics (FRP sleeve)

having a glass fiber, a carbon fiber, an aramid fiber or the like as a reinforcing fiber fiber-reinforced plastic; and a sleeve formed of a polymer film and having a shape maintained by compressed air.

The thickness of the cylindrical support may be arbitrarily selected depending upon the object, and the thickness can be typically sufficient as long as it is 0.1 mm or more and as long as the cylindrical support is not destructed by a pressure applied thereto when it is subjected to printing. In the case that the cylindrical support is a metal sleeve or a hard plastic sleeve, those having a thickness of 5 mm or more may be used as well, and it is also possible to use a cylindrical support having a solid body penetrated by a rotation axis (namely, a cylindrical support which is fixed to a rotating axis).

In view of an effective fixation of a shrinkable relief forming layer to the cylindrical support, the cylindrical support preferably has such characteristics that an inner diameter of the cylindrical support can expand by a air compressed to have pressure of about 6 bars and that it returns to have its initial inner diameter after the compressed air is released. A support having such a structure (namely, a structure with a diameter which can be easily adjusted by compressed air or the like) is preferable since a stress can be applied to the relief forming layer having a sleeve shape from inside thereof, a tightly rolling characteristic of the relief forming layer can work and, the relief layer can be stably fixed on a plate drum even when a stress is applied thereto when it is subjected to printing.

Method of Preparing Relief Printing Plate

The method of preparing a relief printing plate according to the invention has at least exposing the relief printing plate precursor for laser engraving prepared as above by means of a scanning exposure to light using a semiconductor laser which is equipped with a fiber and emits light having a wavelength within a range of 700 nm to 1,300 nm so that a region exposed by the exposing is engraved.

Processes included in the method of preparing a relief printing plate will be successively illustrated below.

When a relief printing plate precursor has a relief forming layer which can form a crosslinking structure, a process of (I) crosslinking, in which a crosslinking structure is formed in the relief forming layer, is firstly carried out.

Then, a process of (II) engraving, in which the relief printing plate precursor for laser engraving prepared as above is exposed by means of a scanning exposure to light using a semiconductor laser which is equipped with a fiber and emits light having a wavelength within a range of 700 nm to 1,300 nm so that a region exposed by the exposing is engraved, is carried out.

Further, a process of (III) rinsing, in which the surface of a relief layer after engraving is rinsed, a process of (IV) drying, in which the relief layer which has been engraved is dried, and/or a process of (V) post-crosslinking, in which energy is applied to the relief layer which has been engraved to form a crosslinking structure, can be carried out if necessity.

The crosslinking (I) includes crosslinking constituents of a relief forming layer of an relief printing plate precursor for laser engraving. The relief forming layer of the precursor of the invention contains a binder polymer and a photo-thermal conversion agent, and may further contain a polymerizable compound and a polymerization initiator if desired.

By the crosslinking (I), the polymerization initiator is provided with energy by at least one of exposure to light and heating so as to generate an polymerization initiation species, by an action of which an unsaturated bond contained in a binder polymer or a polymerizable compound is polymerized or a crosslinking structure is formed to give a hard relief forming layer.

The polymerization initiator is typically a radical generator. Radical generators are roughly classified into photopolymerization initiators and thermal polymerization initiators, depending on whether the trigger of the respective generating radical is light or heat.

When the relief forming layer contains a photopolymerization initiator, a crosslinked structure can be formed in the relief forming layer by irradiating the relief forming layer with active radiation which serves as the trigger of the photopolymerization initiator. The irradiation with active radiation is generally carried out over the entire surface of the relief forming layer. Examples of the active radiation include visible light, ultraviolet radiation and an electron beam, but ultraviolet radiation is most generally used. While it is acceptable to perform the irradiation of the active radiation only to a front surface of a support, which is the opposite side of a rear surface of the relief forming layer which faces the support, it is preferable to irradiate the active radiation also from the rear surface as well as from the front surface when the support is a transparent film which transmits active radiation.

When the protective film is present, the irradiation from the front surface may be carried out with the protective film being provided, or may be carried out after the protective film has been removed. Considering the presence of oxygen which may cause a polymerization inhibition, the irradiation with active radiation may be carried out after coating the crosslinkable relief forming layer with a vinyl chloride sheet under vacuum.

When the relief forming layer contains a thermal polymerization initiator, a crosslinked structure can be formed in the relief forming layer by heating the relief printing plate precursor for laser engraving. Examples of the method of heating may include a method of heating the printing plate precursor in a hot air oven or a far-infrared oven for a predetermined time and a method of contacting the printing plate precursor with a heated roll for a predetermined time.

Since the photo-polymerization initiator can work as the thermal-polymerization initiator in some cases, the conditions of the exposure or the heating may be selected in accordance with the kind of the polymerization initiator, the characteristics of the polymerizable compound which is used in combination and the like. If desired, both of the exposure and the heating can be performed in any order.

The crosslinking with heat can be performed when a vulcanizing agent and/or a thermosetting epoxy resin are contained in the relief forming layer as crosslinking components.

Which of heating or exposure to light is performed for the crosslinking can be selected depending upon properties and objects of a relief forming layer, with the proviso that attention is paid to the followings.

A crosslinking by exposure to light may require a device for irradiation of active ray which is relatively expensive, it is preferable in that temperature of the relief printing plate precursor may not be greatly affected by that. On the other hand, temperature of the printing plate precursor may rise in crosslinking by heating, which may result in deformation of a thermoplastic polymer and/or denaturation of compound having small stability against heat. Accordingly, cares may be necessarily taken to select a compound used in the relief forming layer and to control the heating temperature.

In the case where the crosslinking is performed by exposure to light, it is concerned that a hardening degree (a crosslinking degree) of the surface of a relief forming layer might be differed from that of the inner area of the relief forming layer due to predominant absorption of light by the surface of the relief forming layer, which might make light which reaches the inner area of the relief forming layer be insufficient.

On the other hand the crosslinking performed by heating may achieve a uniform crosslinking at least in a depth (thickness) direction of the relief forming layer.

A method of hardening the resin composition for laser engraving is not particularly limited as long as it results in polymerization reaction of the polymerizable compound, and examples thereof include: heating the composition; irradiating the resin composition with light; adding a photo- or thermal-polymerization initiator to the resin composition in advance and then subjecting the resin composition to irradiation or heat; and a combination of any of these.

Among the above, the heating of the resin composition is particularly preferable as the crosslinking and hardening method due to simplicity and easiness of its operation. Any heating method such as that using an oven, a thermal head, a heating roll or a laser beam may be used for the heating to result in crosslinking (polymerization) of the resin composition which is before being decomposed by laser. Temperature used in the heating of the resin composition can be controlled by either controlling the temperature of the oven, the thermal head, the heating roll or the like or adjusting intensity or spot diameter of the laser beam when the temperature is required to be conducted.

The relief forming layer having the crosslinked structure has advantages that the relief formed therefrom after laser engraving can be sharp (well-defined), and that the adhesiveness of the engraving remnants generated during laser engraving can be suppressed. When an uncrosslinked relief forming layer is laser engraved, due to the residual heat propagated to the peripheries of the laser irradiated part, unintended parts might be prone to melt and deform, and in some cases, a well-defined relief forming layer may not be obtained.

The Shore A hardness of the crosslinked relief forming layer is preferably from 50° to 90°. When the Shore A hardness of the relief layer is 50° or more, the fine dots formed by engraving may not be fall and break even under the high printing pressure of a letterpress printing machine, and proper printing may be achieved. When the Shore A hardness of the relief layer is 90° or less, print scratches at solid parts may be prevented even in flexographic printing with a kiss-touch printing pressure.

Next, the Process of (II) Engraving is Performed.

In the process of (II) engraving, a relief layer for printing is formed by irradiating the relief forming layer with a laser light emitted from a specific laser and corresponding to a desired image to be formed. Herein, the relief forming layer preferably has the crosslinked structure. The engraving includes controlling the laser head with a computer based on the digital data of a desired image to be formed, and performing scanning irradiation over the relief forming layer. When an infrared laser is irradiated by a fiber-coupled semiconductor laser which emits light having a wavelength which is in a range of 700 nm to 1300 nm, molecules in the relief forming layer undergo molecular vibration, and thus heat is generated. When a high power laser such as a carbon dioxide laser or a YAG laser is used as the infrared laser, a large amount of heat is generated at the laser-irradiated areas, and the molecules in the photosensitive layer undergo molecular breakage or ionization, so that selective removal (that is, engraving) can be achieved. The selective removal can be also enhanced by heat which is generated in the exposed area by a photo-thermal conversion agent which can be contained in the relief forming layer.

An advantage of the laser engraving is the ability to three-dimensionally control the structure of the engraved portion since the depth of engraving can be arbitrarily set thereby, For example, when areas for printing fine dots are engraved shallowly or with a shoulder, the relief may be prevented from collapsing under printing pressure. When groove areas for printing cutout characters are engraved deeply, the grooves may be hardly filled with ink, and collapse of the cutout characters may be thus suppressed.

Since the engraving is performed with an infrared laser which corresponds to the maximum absorption wavelength of the photo-thermal conversion agent, a more sensitive and well-defined relief layer can be obtained.

Plate Making Device Equipped with Semiconductor Laser

In general, a semiconductor laser exhibits high efficiency in laser oscillation, is less expensive and can be made smaller as compared with $CO_2$ lasers. Moreover, due to its small size, a semiconductor laser can be easily provided in an array. Control of its beam diameter can be done by an imaging lens or a specific optical fiber. A fiber-coupled semiconductor laser can be effective for the image formation of the invention since it can efficiently output laser beam by an optical fiber installed therein. A shape of the laser beam can be controlled by processing the optical fiber. For example, a beam profile of the laser beam can be made into a top-hat shape so as to stably apply energy to a plate surface. Details of the semiconductor laser are described, for example, in "Laser Handbook", Second Edition, edited by Laser Society and "Practical Laser Technique", Electronic Communication Society.

While any semiconductor laser can be used as ling as it emits light having a wavelength which is in the range of 700 nm to 1300 nm, it is preferably those emitting light having a wavelength which is in the range of 800 nm to 1200 nm, more preferably those emitting light having a wavelength which is in the range of 860 nm to 1200 nm, and further preferably those emitting light having a wavelength which is in the range of 900 nm to 1100 nm.

Since the band gap of GaAs resides at 860 nm at room temperature, semiconductor lasers having a AlGsAs active layer is generally used when light having a wavelength of 860 nm or less is employed. On the other hand, semiconductor lasers having a InGaAs active layer is generally used when light having a wavelength of 860 nm or more is employed. Employment of a wavelength which is in the range of 860 nm to 1200 nm is preferable since the semiconductor lasers having a InGaAs active layer is reliable relative to those having a AlGsAs active layer, the aluminum used therein being generally easily oxidized.

In consideration of configuration of cladding material and the like in addition to the active layer material, the more preferable embodiment of practically-usable semiconductor lasers having a InGaAs active layer include those emitting light having a wavelength which is in the range of 900 nm to 1100 nm, which would provide higher output and higher reliability. Accordingly, the low cost and high productivity can be more easily obtained by the invention when a semiconductor lasers having a InGaAs active layer and emitting light having a wavelength which is in the range of 900 nm to 1100 nm is employed.

The use of the fiber-coupled semiconductor laser with a specific wavelength as defined in the invention may provide a laser engraving flexo printing system which provides excellent image quality with low cost and high productivity.

An embodiment of the plate making device equipped with a fiber-coupled semiconductor laser recording device which can be used in the method of making a printing plate of the invention will be illustrated hereinafter with respect its configuration by referring to FIG. 1.

A plate making device 11 which can be used in the method of the invention is equipped with: a fiber-coupled semiconductor laser recording device 10; and a plate making device 11 has a drum 50, which has an outer circumference surface, on which a printing plate precursor F (recording medium) of the invention can be attached. The laser recording device 10 has: a light source unit 20 which generates plural laser beams; a exposure head 30 which expose the relief printing plate precursor F to the plural laser beams generated by the light source unit 20; and a moving unit 40 of exposure head which moves the exposure head 30 in the auxiliary scanning direction.

The plate making device 11 drives the drum 50 to rotate in a main scanning direction (the direction indicated by an arrow R) and, at the same time, have an exposure head 30 to scan the drum 50 in an auxiliary scanning direction, which is at right angle to the main scanning direction and is indicated by an arrow S, while simultaneously emitting plural laser beams corresponding to image data to be engraved (recorded) from the exposure head 30 to the relief printing plate precursor F, so that a two-dimensional image can be engraved (recorded) on the relief printing plate precursor F at high speed. In the case where a narrow region is engraved (namely, when a precise engraving is performed for forming fine lines, fine dots or the like), the relief printing plate precursor F can be engraved shallowly. In the case where a broad region is engraved, the relief printing plate precursor F can be engraved deeply.

The light source unit 20 is equipped with: semiconductor lasers 21A and 21B, each of which has a broad area semiconductor laser to which an end of each of optical fibers 22A or 22B is indivisually coupled; light source supports 24A and 24B, each of which has the semiconductor laser 21A or 21B aligned on the surface thereof; adaptor supports 23A and 23B, each of which is vertically attached to an end of the light source support 24A or 24B and a plural (the same numbers as in the semiconductor lasers 21A, 21B) adaptors of SC-type light connectors 25A or 25B are installed thereon; and LD (laser diode) driver supports 27A and 27B, each of which is horizontally attached to another end of the light source support 24A or 24B and is installed with a LD driver circuit 26 (not shown in FIG. 1) which drives the semiconductor lasers 21A and 21B corresponding to the image data of the image to be engraved (recorded) on the relief printing plate precursor F.

The exposure head 30 is equipped with a fiber array unit 300 by which laser beams emitted from the plural semiconductor lasers 21A and 21B can be emitted together. Each of the laser beams emitted from the semiconductor laser 21A or 21B is conveyed to the fiber array unit 300 by one among plural optical fibers 70A and 70B, which are connected to the SC-type light connector 25A or 25B connected to the adaptor supports 23A or 23B.

As shown in FIG. 1, the exposure head 30 has a collimator lens 32, an opening material 33 and an imaging lens 34 which are aligned in this order with respect to a position in which the fiber array unit 300 is disposed. The opening material 33 is aligned such that its opening resides at the position of a far field when looked from the side of the fiber array unit 300. As a result, a similar degree of light quantity restricting effect can be provided to all laser beams emitted from the optical fibers 70A or 70B at the fiber array unit 300.

Laser beam L forms an image at a vicinity of the exposure side (surface) FA of the relief printing plate precursor F by an imaging unit having the collimator lens 32 and the imaging lens 34 in its configuration.

The fiber-coupled semiconductor laser can change a shape of the laser beam emitted therefrom. In view of efficient engraving and good reproducibility of fine lines, it is preferable in the invention to control a spot diameter the laser beam to be in a range of 10 μm to 80 μm on the exposed surface (surface of a relief forming layer) FA by, for example, controlling the shape of the laser beam to have the imaging position (image forming position) P be within an area of inner side with respect to the exposure surface FA (the side of forwarding direction of laser beam) or the like.

The exposure head moving unit 40 is equipped with two rails 42 and a ball screw 41 aligned in such a manner that their longitudinal direction are along the auxiliary scanning direction. A pedestal 310 equipped with the exposure head 30 can be moved in an auxiliary scanning direction with being guided by the rail 42 by operating an auxiliary scanning motor 43, which drives and rotates the ball screw 41. The drum 50 can be rotated in the direction of the arrow R when a main scanning motor (not shown) is operated, whereby the main scanning is performed.

It is also possible to control the shape of the engraved region by controlling the amount of energy applied to the surface of the relief forming layer by the laser beam without changing the shape of the laser beam from the fiber-coupled semiconductor laser. Specific examples of the energy amount controlling-method include a method in which output power of the semiconductor laser is changed and a method in which a time length employed for the laser irradiation is changed.

If engraving remnants remain adhered to the engraved surface, the process of (III) rinsing, in which the engraved surface is rinsed with water or with a liquid containing water as a main component to wash away the engraving remnants, may be further performed.

Examples of methods of the rinsing include a method of spraying water at high pressure, or a method of brush rubbing the engraved surface, mainly in the presence of water, using a batch type- or conveyor type-brush washout machine known as a developing machine for photosensitive resin letterpress plates, and the like. If the viscous liquid of the engraving remnants cannot be removed by simply washing with the water or the liquid, a rinsing solution including soap may be used.

When the process of (III) rinsing the engraved surface is performed, it is preferable to further perform the process of (IV) drying, in which the relief layer which has been engraved is dried to volatilize the rinsing solution.

Further, the process of (V) post-crosslinking, in which a crosslinked structure is formed in the relief layer, can be carried out if necessity. By carrying out the process of (V) post-crosslinking, the relief formed by engraving may be further strengthened.

The relief printing plate produced by the method of the invention allows printing with a letterpress printing machine using oily ink or UV ink, and also allows printing with a flexographic printing machine using UV ink by selecting the material of the relief forming layer.

EXAMPLES

The invention will be hereinafter described in more detail by way of Examples, while the invention is not limited thereto.

Preparation of Support to Which Adhesive Layer is Applied Preparation of First Adhesive Layer Application Solution A mixture of 260 parts by weight of a solution of unsaturated polyester resin in toluene (trade name: BAYLON 31 SS, manufactured by Toyobo) and 2 parts by weight of benzoin ethyl ether (trade name: PS-8A, manufactured by Wako Pure Chemical Industries) was heated at 70° C. for 2 hours and cooled down to 30° C., and 7 parts by weight of ethylene glycol diglycidyl ether dimethacrylate was added thereto followed by mixing for 2 hours.

Further, 25 parts by weight of a solution of polyvalent isocyanate resin in ethyl acetate (trade name: CORONATE 3015 E, manufactured by Nippon Polyurethane Industry) and 14 parts by weight of an industrial adhesive agent (trade name: EC-1368, manufactured by Sumitomo 3M) were added thereto to give the first adhesive layer application solution composition.

Preparation of Second Adhesive Layer Application Solution 50 parts by weight of Polyvinyl alcohol having a saponification degree of 78.5% to 81.5% (trade name: GOHSENOL KH-17, manufactured by Nippon Synthetic Chemical Industry) was dissolved in a mixture solvent containing 200 parts by weight of an alcohol mixture (trade name: SOLMIX H-11, manufactured by Nippon Alcohol) and 200 parts by weight of water at 70° C. for 2 hours. 1.5 parts by weight of glycidyl methacrylate (trade name: BLEMMER G, manufactured by NOF) was added thereto, followed by mixing for 1 hour. 3 parts by weight of a copolymer of (dimethylaminoethyl methacrylate/(2-hydroxyethyl methacrylate)/(methacrylic acid) (copolymerizing ratio: 67/32/1), 5 parts by weight of benzyldimethyl ketal (IRGACURE® 651, manufactured by Ciba-Geigy), 21 parts by weight of an adduct of acrylic acid to propylene glycol diglycidyl ether (trade name: EPOXYESTER 70 PA, manufactured by Kyoeisha Kagaku) and 20 parts by weight of ethylene glycol diglycidyl ether dimethacrylate were then added thereto, followed by mixing for 90 minutes. The resulted mixture was cooled down to 50° C., and 0.1 part by weight of FLUORAD™ FC-430 (manufactured by Sumitomo 3M) was added thereto followed by mixing for 30 minutes to give the second adhesive layer application solution composition.

Formation of Adhesive Layer

The first adhesive layer application solution composition was applied on a polyester film having a thickness of 250 μm (trade name: LUMIRROR T60, manufactured by Toray), which is used as a support, using a bar coater to make the thickness of a resulted film after dried be 40 μm, and the solvent in the first adhesive layer application solution composition was removed by an oven set at 180° C. for 3 minutes to form a first adhesive layer. Then, the second adhesive application solution composition was applied thereon using a bar coater to make the thickness a resulted film after dried be 30 μm, and the resultant was dried in an oven set at 160° C. for 3 minutes to give a layered body having the first adhesive layer and the second layer successively formed on the surface of the support.

Preparation of Protective Film Having Slip Coat Layer 4 parts by weight Polyvinyl alcohol having a saponification degree of 91% to 94% (trade name: GOHSENOL AL-06, manufactured by Nippon Synthetic Chemical Industry) was dissolved in a mixed solvent containing 55 parts by weight of water, 14 parts by weight of methanol, 14 parts by weight of n-propanol and 10 parts by weight of n-butanol to give an application solution composition for formation of a slip coat layer.

The application solution composition for formation of a slip coat layer was applied on a polyester film having a thickness of 100 μm (trade name: LUMIRROR S-10, manufactured by Toray) using a bar coater to make the thickness of a resulted film after dried be 1.0 μm, followed by drying at 100° C. for 25 seconds to give a protective film having a slip coat layer on one side thereof.

Preparation of Relief Printing Plate Precursor for Laser Engraving (1)

40 parts by weight of Polyvinyl alcohol (the compound shown in Table 1) as a binder polymer, 20 parts by weight of diethylene glycol as a plasticizer and 35 parts by weight of water and 12 parts by weight of ethanol as solvents were placed in a three-necked flask equipped with a stirring spatula and a cooling pipe and heated at 70° C. for 120 minutes with stirring to give a binder polymer.

20 parts by weight of polyethylene glycol 600 diacrylate which is an ethylenic unsaturated monomer (LIGHT ACRYLATE 14EG-A, manufactured by Kyoeisha Kagaku), 1.5 parts by weight of benzyl dimethyl ketal (IRGACURE® 651, manufactured by Ciba-Geigy) as a photopolymerization initiator, 0.7 part by weight of diphenyliodonium anthraquinone sulfate as a thermal acid generator, 0.05 part by weight of antifoaming agent (NOPCO DF 122-NS, manufactured by Sannopco), 0.005 part by weight of ammonium N-nitrosophenylhydroxylamine (Q-1300, manufactured by Wako Pure Chemical Industries) as a polymerization inhibitor, an additive (polylactide resin emulsion, trade name: LANDY PL-2000, manufactured by Miyoshi Oil & Fat Co., Ltd.) and a photo-thermal conversion agent (carbon black. trade name: ASAHI#80(N-220), manufactured by Asahi Carbon Co,Ltd.) were added to the resulted polymer solution, followed by stirring for 30 minutes to give an application solution composition for forming a relief forming layer having fluidity.

The second adhesive layer side of the support having two adhesive layers was exposed at 1,000 mJ/cm$^2$ using a super high-voltage mercury lamp, and the application solution composition for forming a relief forming layer was flown on the surface of the second adhesive layer side followed by drying the resultant for 2 hours in an oven set at 60° C. to give a layered body having a non-crosslinked relief forming layer having the thickness of about 1,100 μm, which includes the thickness of the support.

The application solution composition for forming a relief forming layer was further applied between the non-crosslinked relief forming layer of the layered body and the slip coat layer of a protective film, and lamination of the resultant was performed using a calendar roll heating at 85° C. to give a layered body having a layer configuration of protective film/slip coat layer/non-crosslinked relief forming layer/second adhesive layer/first adhesive layer/support. Clearance of the calendar roll was adjusted so that the thickness of the layered body after releasing the protective film from the layer product becomes 1,140 μm. When the applied application solution composition for forming a relief forming layer was allowed to stand for one day after the lamination, the residual solvent was diffused and moved or naturally dried to form an additional non-crosslinked relief forming layer.

The layered body prepared as such was heated in an oven set at 120° C. for 30 minutes so that the non-crosslinked relief forming layer was crosslinked. A printing plate precursor 1 for relief plate for laser engraving having a protective film was thus prepared.

Each of printing plate precursors 2 to 5 for relief plate for laser engraving was further prepared in the same manner as the printing plate precursor 1, except that the binder polymer, the additive and the addition amount thereof, and the photo-thermal conversion agent and the addition amount thereof were changed as shown in the following Table 1.

Preparation of Relief Printing Plate Precursor for Laser Engraving (2)

Synthesis of Specific Polyurethane Resin

Synthetic Example 1

Synthesis of Polyurethane resin P-1

8.2 g (0.05 mol) of 2,2-Bis(hydroxymethyl)butanoic acid and 13.0 g (0.05 mol) of the following diol compound (1) were dissolved in 100 ml of N,N-dimethylacetamide in a 500-ml three-necked round bottom flask equipped with a condenser and a stirrer. 25.5 g (0.102 mol) of 4,4-diphenylmethane diisocyanate and 0.1 g of dibutyl tin dilaurylate were added to the resultant, followed by heating at 100° C. for 8 hours with stirring. After that, the resultant was diluted with 100 ml of N,N-dimethylformamide and 200 ml of methyl alcohol followed by stirring for 30 minutes. The reaction solution was poured into 3 liters of water with stirring so that a white polymer was precipitated. The polymer was taken by filteration, washed with water and dried under vaccum to give 37 g of polymer.

A molecular weight of the polymer was measured by means of gel permeation chromatography (GPC) and turned out to be 95,000 in terms of the weight-average molecular weight (based on polystyrene).

Diol Compound (1)

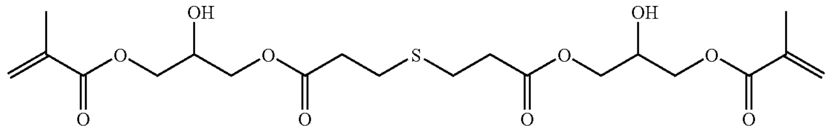

Preparation of Relief Forming Material 50 parts by weight of the polyurethane resin (P-1), an additive and a photo-thermal conversion agent (the compounds with the amounts shown in Table 1), 25 parts by weight of lauryl acrylate as a polymerizable compound, and an initiator (IRGACURE® 369, manufactured by Ciba-Geigy) were dissolved in toluene at 100° C., and the resulting application solution composition for forming a relief forming layer was cooled down to 40° C.

The second adhesive layer side of the support having two adhesive layers was exposed at 1,000 mJ/$cm^2$ using a super high-voltage mercury lamp in the same manner as in the precursor preparation-process (1), and the application solution composition for forming a relief forming layer containing the P-1 was flown on the surface of the second adhesive layer side followed by drying the resultant for 2 hours in an oven set at 100° C. to give a layered body having a non-crosslinked relief forming layer having the thickness of about 1,100 μm, which includes the thickness of the support. Thus, printing plate precursors 6 to 8 for relief printing plate for laser engraving were prepared.

Examples 1 to 7 and Comparative Examples 1 to 4

Preparation of Relief Printing Plate

1. Engraving

In Examples 1 to 7 and Comparative Examples 1 to 2, a laser recording device as shown in FIG. 1 equipped with a fiber-coupled semiconductor laser diode (FC-LD) having the maximum output power of 8.0 W (trade name: SDL-6390, manufactured by JDSU; wavelength: 915 nm) was used. A solid image of 1 cm-square was subjected to a raster engraving using a semiconductor laser engraving device under the condition where laser output power was 6 W. head speed was 100 mm/second and pitch setting was 2,400 DPI.

In Example 8, a laser recording device as shown in FIG. 1 equipped with a fiber-coupled semiconductor laser diode (FC-LD) having the maximum output power of 8.0 W (trade name: 6397-L3, manufactured by JDSU; wavelength: 940 nm) was used. A solid image of 1 cm-square was subjected to a raster engraving using a semiconductor laser engraving device under the condition where laser output power was 6 W. head speed was 100 mm/second and pitch setting was 2,400 DPI.

In Comparative Example 3, high-quality $CO_2$ laser marker ML-9100 series (trade name, manufactured by Keyence, wavelength: 10.6 μm) was used as a $CO_2$ gas laser engraving device for engraving by laser irradiation. After a protective film was released from the printing plate precursor 1 for printing plate for laser engraving, a solid image of 1 cm-square was subjected to a raster engraving using the $CO_2$ gas laser engraving device under the condition in which output power was 12 W. head speed was 200 mm/second and pitch setting was 2,400 DPI.

In Comparative Example 4, a semiconductor laser engraving device having no fiber, which was prepared by employing SCT 200-808-Z6-01 (trade name, manufactured by ProLiteR, wavelength: 808 nm) was employed in place of the FC-LD in the device used in Example 1. The device (light source) is indicated as "LD" in Table 2. A solid image of 1 cm-square was subjected to a raster engraving using the semiconductor laser engraving device under the condition where laser output power was 6 W. head speed was 100 mm/second and pitch setting was 2,400 DPI.

TABLE 1

| | | Additive | | Photo-thermal conversion agent | | |
|---|---|---|---|---|---|---|
| | Binder Polymer | Compound | Added Amount (wt %) | Carbon Black | Oil-Absorbing Amount (ml/100 g) | Added Amount (wt %) |
| Printing plate precursor 1 | Polyvinyl alcohol (PVA-205) | Polylactic acid (LANDY 2000) | 20 | Asahi #80 (N-220) | 113 | 0.7 |
| Printing plate precursor 2 | Polyvinyl alcohol (PVA-205) | Polylactic acid (LANDY 1000) | 20 | Asahi #55 (N-660) | 87 | 0.8 |

TABLE 1-continued

| | | Additive | | Photo-thermal conversion agent | | |
|---|---|---|---|---|---|---|
| | Binder Polymer | Compound | Added Amount (wt %) | Carbon Black | Oil-Absorbing Amount (ml/100 g) | Added Amount (wt %) |
| Printing plate precursor 3 | Polyvinyl alcohol (PVA-205) | Benzoylformic acid (Wako) | 2 | N 326 | 75 | 0.1 |
| Printing plate precursor 4 | Polyvinyl alcohol (PVA-205) | Polylactic acid (LANDY 2000) | 20 | (none) | — | — |
| Printing plate precursor 5 | Polyvinyl alcohol (LW 100) | Polylactic acid (LANDY 2000) | 20 | Asahi #55 (N-660) | 87 | 0.8 |
| Printing plate precursor 6 | Polyurethane resin (P-1) | — | — | Asahi #55 (N-660) | 87 | 0.8 |
| Printing plate precursor 7 | Polyurethane resin (P-1) | — | — | Asahi #55 (N-660) | 87 | 0.8 |
| Printing plate precursor 8 | Polyurethane resin (P-1) | — | — | DIA BLACK SA (Mitsubishi Chemical) | 165 | 0.8 |

In Table 1, printing plate precursors 1 to 3 and printing plate precursors 5 to 8 are relief printing plate precursors according to the invention, and the printing plate precursor 4, which contains no photo-thermal conversion agent in a relief forming layer thereof, is a relief printing plate precursor for comparison.

Details of the binder polymers, the additives and the carbon blacks shown in the above Table 1 are as follows.

Binder Polymers:

PVA-205: polyvinyl alcohol, trade name, manufactured by Kuraray

GOSEFIMER LW 100: polyvinyl alcohol, trade name, manufactured by Nippon Synthetic Chemical)

Additives:

LANDY 2000: polylactic acid, trade name, manufactured by Miyoshi Oil & Fat Co., Ltd.

LANDY 1000: polylactic acid, trade name, manufactured by Miyoshi Oil & Fat Co., Ltd.

Benzoylformic acid: manufactured by Wako Pure Chemical Industries

Light-heat Concerting Agents:

ASAHI #80 (N-220): carbon black, trade name, manufactured by Asahi Carbon Co,Ltd.

ASAHI #55 (N-660): carbon black, trade name, manufactured by Asahi Carbon Co,Ltd.

SEAST 9H SAF-HS: carbon black, trade name, manufactured by Tokai Carbon Co,Ltd.

N 326: carbon black, trade name, manufactured by Cabot Japan K.K.

DIA BLACK SA: carbon black, trade name, manufactured by Mitsubishi Chemical Corporation Evaluations 2. Width of Engraved Fine Line:

Engraved depth is a distance between an engraved position (height) and a non-engraved position (height) when a relief printing plate is observed in its cross section and can be measured by observing with a SEM (Scanning Electron Microscope). The minimum fine line width which engraved depth of not less than 0.002 mm, which is shown as "Minimum Open Fine Line Width" in Table 2, was measured herein. It is evaluated that, The smaller the fine line width is, the higher the engraving sensitivity and reproducibility in highly fine image are.

3. Productivity

An area which can be engraved within one hour was calculated based on the time required for engraving a solid image of 1 cm-square with the engraved depth of 0.5 mm by a raster engraving under the condition where the pitch setting was 2,400 DPI. The larger the resulting numeral is, the higher the recording sensitivity is and the better the productivity is.

The results are shown in the following Table 2.

TABLE 2

| | Light Source | Printing plate precursor | Minimum Open Fine Line Width (mm) | Productivity ($m^2$/hr) |
|---|---|---|---|---|
| Example 1 | FC-LD | Printing plate precursor 1 | 0.025 | 1.0 |
| Example 2 | FC-LD | Printing plate precursor 2 | 0.027 | 1.2 |
| Example 3 | FC-LD | Printing plate precursor 3 | 0.028 | 1.1 |
| Example 4 | FC-LD | Printing plate precursor 5 | 0.026 | 1.0 |
| Example 5 | FC-LD | Printing plate precursor 6 | 0.026 | 1.1 |
| Example 6 | FC-LD | Printing plate precursor 7 | 0.025 | 1.1 |
| Example 7 | FC-LD | Printing plate precursor 8 | 0.035 | 0.6 |
| Example 8 | FC-LD | Printing plate precursor 1 | 0.025 | 1.0 |
| Comparative Example 1 | FC-LD | Printing plate precursor 4 | — | Engraving was impossible |
| Comparative Example 2 | $CO_2$ | Printing plate precursor 4 | 0.045 | 0.4 |
| Comparative Example 3 | $CO_2$ | Printing plate precursor 1 | 0.040 | 0.5 |
| Comparative Example 4 | LD | Printing plate precursor 1 | 0.042 | 0.3 |

From the results shown in Table 2, it was understood that the manufacturing method of the invention using the relief printing plate precursor according to the invention can be highly productive to efficiently form a highly precise image, and the relief printing plate precursor according to the invention can have high engraving sensitivity.

Example 9

50 parts by weight of polyvinyl butyral (trade name: #3000-1, manufactured by Denki Kagaku Kogyo) as a binder polymer, 20 parts by weight of diethylene glycol as a plasticizer and 30 parts by weight of ethanol as a solvent were placed in a three-necked flask equipped with a stirring spatula and a cooling pipe and heated at 70° C. for 120 minutes to dissolve the binder polymer.

15 parts by weight of an ethylenic unsaturated monomer (trade name: LIGHT ACRYLATE 14EG-A, diacrylate of polyethylene glycol 600, manufactured by Kyoeisha Kagaku), 15 parts by weight of polyalkylene glycol(meth) acrylate monomer (trade name: BLEMMER PE-200, manufactured by NOF), 1.5 parts by weight of tert-butyl peroxide (trade name: PERBUTYL Z, manufactured by NOF) as a polymerization initiator and 0.005 part by weight of ammonium N-nitrosophenyl hydroxylamine (trade name: Q-1300, manufactured by Wako Pure Chemical Industries), 3 parts by weight of $ZnCl_2$ (manufactured by Wako Pure Chemical Industries) as a polymerization inhibitor and 0.7 part by weight of carbon black (trade name: SEAST 9H SAF-HS, described above) were added to the resulting polymer solution, followed by stirring for 30 minutes to give an application solution composition for forming a relief forming layer having fluidity.

A printing plate precursor 9 for relief printing plate for laser engraving was obtained in the same manner as Example 1, except that the application solution composition for forming a relief forming layer for Example 9 was used in place of the application solution composition containing the PVA-205 (described above).

Example 10

50 parts by weight of styrene-butadiene polymer (trade name: NIPOL NS 116R, manufactured by Nippon Zeon) as a binder polymer, 0.7 part by weight of carbon black (SEAST 9H SAF-HS, manufactured by Tokai Carbon) and 30 parts by weight of methyl ethyl ketone were placed in a three-necked flask equipped with a stirring spatula and a cooling pipe and stirred for 30 minutes to give an application solution composition for forming a relief forming layer having fluidity. This application solution composition for forming a relief forming layer for Example 10 was flown on the surface of the second adhesive layer side of the support which was the same as that used in Example 1 and dried for 1 hour in an oven set at 100° C. to form a layered body having a non-crosslinked relief forming layer having a thickness of about 1,100 μm, which includes a thickness of the support, so that a printing plate precursor 10 for relief printing plate for laser engraving was prepared.

Example 11

40 parts by weight of polyamide resin (trade name: ULTRANID IC, manufactured by BASF) as a binder polymer, 10 parts by weight of diethylene glycol as a plasticizer and 40 parts by weight of ethanol as a solvent were placed in a three-necked flask equipped with a stirring spatula and a cooling pipe and heated at 70° C. for 120 minutes to dissolve the binder polymer.

20 parts by weight of an ethylenic unsaturated monomer (trade name: LIGHT ACRYLATE 14EG-A, described above), 1.5 parts by weight of tert-butyl peroxide (trade name: PERBUTYL Z, described above) as a polymerization initiator and 0.005 part by weight of ammonium N-nitrosophenyl hydroxylamine (trade name: Q-1300, described above), 3 parts by weight of $ZnCl_2$ (manufactured by Wako Pure Chemical Industries) as a polymerization inhibitor and 0.7 part by weight of carbon black (trade name: SEAST 9H SAF-HS, described above) were added to the resulting polymer solution, followed by stirring for 30 minutes to give an application solution composition for forming a relief forming layer having fluidity.

A printing plate precursor 11 for relief printing plate for laser engraving was obtained in the same manner as Example 1, except that the application solution composition for forming a relief forming layer for Example 11 was used in place of the application solution composition containing the PVA-205 (described above).

The thus-obtained printing plate precursors 9 to 11 were evaluated in the same manner as Examples 1 to 8. The results thereof are shown in the following Table 3.

TABLE 3

| | Binder Polymer | Printing plate precursor | Light Source | Minimum Open Fine Line Width (mm) | Productivity ($m^2$/hr) |
|---|---|---|---|---|---|
| Example 9 | Polyvinyl butyral "#3000-1" | Printing plate precursor 9 | FC-LD | 0.026 | 1.0 |
| Eample 10 | Styrene-butadiene copolymer "NIPOL NS 116R" | Printing plate precursor 10 | FC-LD | 0.028 | 0.8 |
| Example 11 | Polyamide resin "ULTRAMIDE IC" | Printing plate precursor 11 | FC-LD | 0.029 | 0.7 |

From the results shown in Table 3, it was understood that the manufacturing method of the invention using the relief printing plate precursor according to the invention can be highly productive to efficiently form a highly precise image, and the relief printing plate precursor according to the invention can have high engraving sensitivity, even when PVB, SBR or polyamide was used as a binder polymer in the relief forming layer.

What is claimed is:

1. A method of manufacturing a relief printing plate, the method comprising:

engraving an area which is within a relief forming layer of a relief printing plate precursor for laser engraving, and exposing the area to scanning exposure using a fiber-coupled semiconductor laser that emits a laser beam with a wavelength in a range of 700 nm to 1300 nm, the relief printing plate precursor comprising a relief forming layer provided over a support, and the relief forming layer comprising a binder polymer and a photo-thermal conversion agent, wherein the photo-thermal conversion agent comprises a carbon black, and wherein the binder polymer comprises at least one polyvinyl butyral.

2. The method of manufacturing a relief printing plate of claim 1, wherein the laser beam has a wavelength in a range of 900 nm to 1100 nm.

3. The method of manufacturing a relief printing plate of claim 1, further comprising controlling a shape of the laser beam so that a spot diameter of the laser beam on an exposed surface of the relief forming layer is in a range of 10 μm to 80 μm.

4. The method of manufacturing a relief printing plate of claim 1, further comprising controlling an amount of energy applied to an exposed surface of the relief forming layer by the laser beam without changing a shape of the laser beam.

5. The method of manufacturing a relief printing plate of claim 1, wherein the relief forming layer further comprises a polymerizable compound.

6. The method of manufacturing a relief printing plate of claim 5, further comprising crosslinking at least the polymerizable compound by at least one of heating and exposing to form a crosslinked structure in the relief forming layer.

7. The method of manufacturing a relief printing plate of claim 1, wherein the content of the photo-thermal conversion agent in the composition for forming the relief forming layer is in the range of 0.01% by mass to 20% by mass.

8. The method of manufacturing a relief printing plate of claim 1, wherein the composition for forming the relief forming layer further comprises polylactic acid.

9. The method of manufacturing a relief printing plate of claim 1, wherein the carbon black has an oil absorbing amount of less than 150 ml/100 g.

* * * * *